United States Patent
Bae et al.

(10) Patent No.: US 11,417,636 B2
(45) Date of Patent: Aug. 16, 2022

(54) DISPLAY DEVICE AND MANUFACTURING METHOD THEREOF

(71) Applicant: Samsung Display Co., Ltd., Yongin-si (KR)

(72) Inventors: Su Bin Bae, Yongin-si (KR); Seon Il Kim, Yongin-si (KR); Sung Won Cho, Yongin-si (KR); Yun Jong Yeo, Yongin-si (KR); Yu Gwang Jeong, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 28 days.

(21) Appl. No.: 17/094,630

(22) Filed: Nov. 10, 2020

(65) Prior Publication Data
US 2021/0217738 A1    Jul. 15, 2021

(30) Foreign Application Priority Data
Jan. 9, 2020    (KR) .................. 10-2020-0003374

(51) Int. Cl.
| H01L 25/075 | (2006.01) |
| H01L 25/16  | (2006.01) |
| H01L 33/62  | (2010.01) |

(52) U.S. Cl.
CPC ........ *H01L 25/0753* (2013.01); *H01L 25/167* (2013.01); *H01L 33/62* (2013.01); *H01L 2933/0066* (2013.01)

(58) Field of Classification Search
CPC ... H01L 25/0753; H01L 25/167; H01L 33/62; H01L 2933/0066; H01L 33/20;
(Continued)

(56) References Cited

U.S. PATENT DOCUMENTS

2005/0236639 A1* 10/2005 Abe .................. H01L 33/62
                                                                          257/E33.059
2016/0141477 A1* 5/2016 Mineshita ........... H01L 33/62
                                                                           257/98

(Continued)

FOREIGN PATENT DOCUMENTS

| EP | 3 399 550 A1 | 11/2018 |
| EP | 3 557 620 A1 | 10/2019 |
| KR | 10-2020-0063380 | 6/2020 |

*Primary Examiner* — Victor A Mandala
(74) *Attorney, Agent, or Firm* — Lewis Roca Rothgerber Christie LLP

(57) ABSTRACT

A display device includes a substrate and a display element layer on the substrate. The display element layer includes: first and second electrodes extending along a first direction and spaced apart from each other in a second direction; and light emitting elements electrically connected to the first and second electrodes. The first electrode has a first convex portion convex toward the second electrode and a first concave portion concave in a direction away from the second electrode, and the second electrode has a second convex portion convex toward the first electrode and a second concave portion concave in a direction away from the first electrode. The light emitting elements includes a first and second light emitting elements, respectively close to the first concave portion and the second concave portion based on an imaginary extension line extending in the first direction between the first electrode and the second electrode.

23 Claims, 37 Drawing Sheets

(58) Field of Classification Search
CPC ... H01L 33/52; H01L 2933/005; H01L 27/15; H01L 33/38; H01L 2933/0016; H01L 27/156; H01L 21/76895; H01L 33/005; H01L 33/02

See application file for complete search history.

(56) References Cited

U.S. PATENT DOCUMENTS

| | | | |
|---|---|---|---|
| 2017/0277315 A1* | 9/2017 | Wu | G06F 3/0443 |
| 2018/0046004 A1 | 2/2018 | Yamazaki et al. | |
| 2018/0294381 A1* | 10/2018 | Wu | H01L 25/0753 |
| 2019/0326348 A1 | 10/2019 | Im et al. | |
| 2021/0408108 A1* | 12/2021 | Kwag | H01L 33/20 |
| 2022/0028923 A1* | 1/2022 | Li | H01L 33/38 |

* cited by examiner

DISPLAY DEVICE AND MANUFACTURING METHOD THEREOF

CROSS-REFERENCE TO RELATED APPLICATION

This application claims priority to and the benefit of Korean Patent Application No. 10-2020-0003374, filed in the Korean Intellectual Property Office on Jan. 9, 2020, the entire content of which is incorporated herein by reference for all purposes as if fully set forth herein.

BACKGROUND

1. Field

Aspects of example embodiments of the present invention relate generally to a display device and a manufacturing method thereof.

2. Description of Related Art

A light emitting diode (hereinafter referred to as an LED) has relatively good durability even in harsh environmental conditions and has excellent performance in terms of lifetime and luminance. Recently, research toward applying LEDs to various display devices has been conducted.

A technique for manufacturing an ultra-small rod-like LED (e.g., an LED having a rod-like shape), which has micro scale (e.g., about 1 μm to about 100 μm) or nano scale (e.g., about 1 nm to about 100 nm) size, having an inorganic crystal structure, for example, a structure in which a nitride semiconductor is grown, has been researched. For example, the rod-like LED may be manufactured to have a size small enough to configure (e.g., to form or be included in) a pixel of a self-luminous display device.

The above information disclosed in this Background section is for enhancement of understanding of the background of the present invention, and therefore, it may contain information that does not form the prior art that is already known to a person of ordinary skill in the art.

SUMMARY

Embodiments of the present invention provide a display device having excellent alignment of light emitting elements and a manufacturing method thereof.

An embodiment of the present invention provides a display device including a substrate and a display element layer on one surface of the substrate. The display element layer includes: first and second electrodes extending along a first direction and spaced apart from each other in a second direction different from the first direction; and light emitting elements electrically connected to the first electrode and the second electrode. The first electrode has, in a plan view, a first convex portion convex toward the second electrode and a first concave portion concave in a direction away from the second electrode, and the second electrode has, in the plan view, a second convex portion convex toward the first electrode and a second concave portion concave in a direction away from the first electrode. The light emitting elements include, based on an imaginary extension line extending in the first direction between the first electrode and the second electrode, a first light emitting element close to the first concave portion, and a second light emitting element close to the second concave portion.

The first concave portion and the second concave portion may be alternately arranged along the first direction, and the first convex portion and the second convex portion may be alternately arranged along the first direction.

The first convex portion may face the second concave portion, and the second convex portion may face the first concave portion.

The first light emitting element may be between the first concave portion and the second convex portion, and the second light emitting element may be between the second concave portion and the first convex portion.

The display element layer may further include: a first contact electrode electrically connecting the first electrode to the light emitting elements, and a second contact electrode electrically connecting the second electrode to the light emitting elements.

An area at where the first contact electrode overlaps the first light emitting element may be greater than an area at where the second contact electrode overlaps the first light emitting element.

An area at where the first contact electrode overlaps the second light emitting element may be smaller than an area at where the second contact electrode overlaps the second light emitting element.

The display element layer may further include a first bank and a second bank on the substrate, extending along the first direction, and spaced apart from each other along the second direction. The first electrode may be on the first bank, and the second electrode may be on the second bank.

The first bank may have a first bank convex portion convex toward the second bank in the plan view and a first bank concave portion concave in a direction away from the second bank, and the second bank may have a second bank convex portion convex toward the first bank in the plan view and a second bank concave portion concave in a direction away from the first bank.

The first convex portion may overlap the first bank convex portion and may have a shape corresponding to a planar shape of the first bank convex portion, and the first concave portion may overlap the first bank concave portion and may have a shape corresponding to a planar shape of the first bank concave portion. The second convex portion may overlap the second bank convex portion and may have a shape corresponding to a planar shape of the second bank convex portion, and the second concave portion may overlap the second bank concave portion and may have a shape corresponding to the planar shape of the second bank concave portion.

The display element layer may further include an insulating layer covering the first and second electrodes, and the light emitting elements may be on the insulating layer.

The insulating layer may have an accommodating portion between the first electrode and the second electrode and may be recessed in a third direction toward the substrate. The light emitting elements may be on the accommodating portion of the insulating layer.

A thickness of the insulating layer at the accommodation portion in the third direction may be equal to or less than half the thicknesses of the first and second banks in the third direction.

The second concave portion may have a first sub concave portion alternately arranged with the first concave portion along the first direction and a second sub concave portion facing the first concave portion.

The light emitting elements may further include a third light emitting element between the first concave portion and the second sub concave portion.

The first and second convex portions may have a polygonal shape or a rounded curved shape.

Each of the first and second electrodes may have at least two widths along the first direction.

The first convex portion and the second convex portion may have a non-square boundary.

A region between the first electrode and the second electrode may have a width that is not constant along the first direction.

An embodiment of the present invention provides a manufacturing method of a display device. The method including: forming a first bank and a second bank on a substrate, the first bank and the second bank extending along a first direction and spaced apart from each other along a second direction different from the first direction; forming a first electrode on the first bank and a second electrode on the second bank, the first electrode having, in a plan view, a first convex portion convex toward the second electrode and a first concave portion concave in a direction away from the second electrode, the second electrode having, in the plan view, a second convex portion convex toward the first electrode and a second concave portion concave in a direction away from the first electrode; providing light emitting elements on the substrate after the forming of the first and second electrodes; and arranging the light emitting elements between the first electrode and the second electrode by applying an alignment signal to the first and second electrodes. The arranged light emitting elements include a first light emitting element close to the first concave portion and a second light emitting element close to the second concave portion.

The forming of the first bank and the second bank may include: forming, in the first bank, a first bank convex portion convex toward the second bank in the plan view and a first bank concave portion concave in a direction away from the second bank; and forming, in the second bank, a second bank convex portion convex toward the first bank in the plan view and a second bank concave portion concave in a direction away from the first bank.

The manufacturing method of the display device may further include: forming an insulating layer covering the first and second electrodes, and forming an accommodating portion in the insulating layer between the first electrode and the second electrode. The accommodating portion may be recessed in a third direction toward the substrate.

The manufacturing method of the display device may further include forming a first contact electrode electrically connecting the first electrode and the light emitting elements and a second contact electrode electrically connecting the second electrode and the light emitting elements.

According to embodiments of the present invention, a display device having excellent alignment of light emitting elements and a manufacturing method thereof is provided.

According to an embodiment of the present invention, a first concave portion included in a first electrode and a second concave portion included in a second electrode are alternately arranged, thereby effectively reducing the number of unarranged light emitting elements.

However, the present invention is not limited to the above-described aspects and features, and embodiments of the present invention may be variously extended, changed, and/or varied without departing from the spirit and scope of the present invention.

DETAILED DESCRIPTION

Figure 1A:
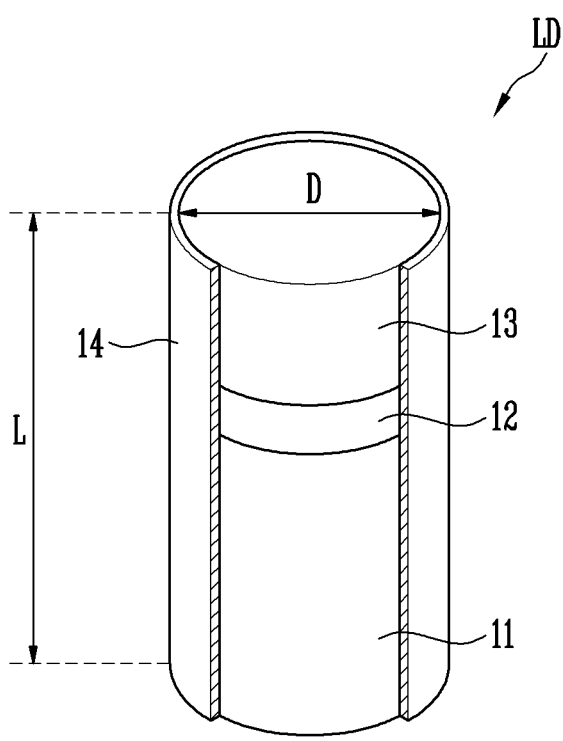
FIGS. 1A and 1B respectively illustrate perspective views of a light emitting element according to an embodiment of the present invention.

Because the present invention may be embodied in various forms and may be variously modified, example embodiments of the present invention will be illustrated and described, in detail, below. The present invention is not, however, limited to the example embodiments described herein, and the present disclosure is to be understood as including the present invention and all changes, equivalents, and substitutes in the spirit and scope of the present invention.

Like reference numerals indicate like elements through the disclosure. In the accompanying drawings, dimensions of structures, layers, components, openings, etc. may be exaggerated for clarity.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

Terms such as first, second, and the like will be used only to describe various constituent elements, layers, etc. and are not to be interpreted as limiting these constituent elements, layers, etc. The terms are only used to differentiate one constituent element, layer, etc. from other constituent elements, layers, etc. For example, a first constituent element could be termed a second constituent element, and similarly, a second constituent element could be termed as a first constituent element, without departing from the scope of the present invention.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments of the present invention and is not intended to be limiting of the described example embodiments of the present invention. As used herein, the singular forms "a" and "an" are intended to include the plural forms as well, unless the context clearly indicates otherwise. It will be further understood that the terms "includes," "including," "comprises," "comprising," "have," "having," and the like, when used in this specification, specify the presence of stated features, integers, steps, operations, elements, and/or components but do not preclude the presence or addition of one or more other features, integers, steps, operations, elements, components, and/or groups thereof.

Hereinafter, embodiments of the present invention will be described, in detail, with reference to the accompanying drawings.

Figure 1B:
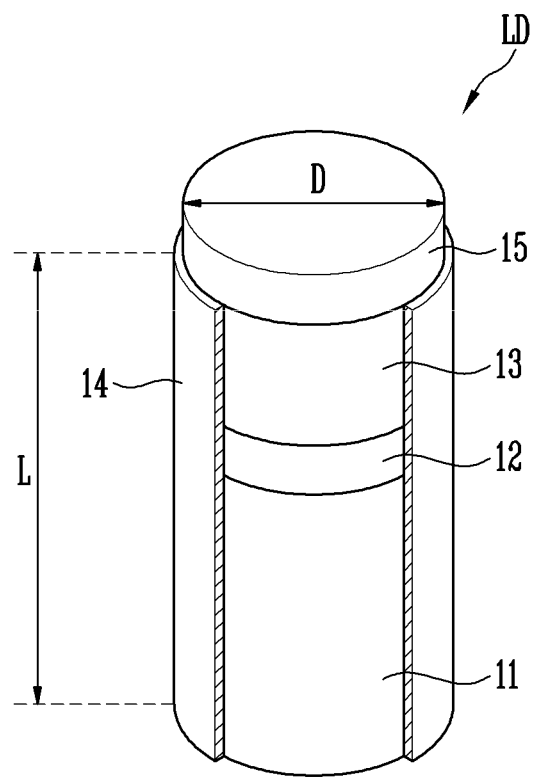

FIGS. 1A and 1B respectively illustrate perspective views of a light emitting element according to an embodiment of the present invention. In FIGS. 1A and 1B, a circular columnar light emitting element LD (e.g., a light emitting element having a circular column shape) is shown, but the present invention is not limited thereto.

Referring to FIGS. 1A and 1B, the light emitting element LD according to an embodiment of the present invention may include a first semiconductor layer 11, a second semiconductor layer 13, and an active layer 12 interposed between the first semiconductor layer 11 and the second semiconductor layer 13.

For example, the light emitting element LD may be implemented as a stacked body in which the first semiconductor layer 11, the active layer 12, and the second semiconductor layer 13 are sequentially stacked on each other.

According to an embodiment of the present invention, the light emitting element LD may have a rod shape extending along one direction. When an extension direction of the light emitting element LD is referred to as a length direction, the light emitting element LD may be provided with one end portion and the other end portion along the length direction.

In an embodiment of the present invention, one of the first semiconductor layer 11 and the second semiconductor layer 13 may be disposed at one end portion (e.g., a first portion), and the other one of the first semiconductor layer 11 and the second semiconductor layer 13 may be disposed at the other end portion (e.g., a second portion).

The light emitting element LD is not limited to the circular columnar shape shown in FIGS. 1A and 1B and may have various suitable shapes. For example, the light emitting element LD may have a rod-like shape or a bar-like shape that is long in (e.g., extends in) the length direction (e.g., has an aspect ratio greater than 1). In an embodiment of the present invention, a length L of the light emitting element LD in the length direction may be greater than a diameter D thereof (or a width of a cross-section thereof). The light emitting element LD may include (or may be), for example, a light emitting diode having an ultra-small size having a diameter D and/or a length L on a micro scale or a nano scale. In an embodiment of the present invention, a size of the light emitting element LD may be varied (or selected) to meet requirements (or design conditions) of a lighting device or a self-luminous display device to which the light emitting element LD is to be applied.

For example, the first semiconductor layer 11 may include at least one n-type semiconductor layer. For example, the first semiconductor layer 11 may include at least one semiconductor material, such as InAlGaN, GaN, AlGaN, InGaN, AlN, and InN, and may include a semiconductor layer doped with a first conductive dopant, such as Si, Ge, Sn, or the like. However, the material included in the first semiconductor layer 11 is not limited thereto, and the first semiconductor layer 11 may be formed of (or may include) various suitable materials.

The active layer 12 is formed on the first semiconductor layer 11 and may have a single or multiple quantum well structure. In various embodiments of the present invention, a clad layer doped with a conductive dopant may be formed in an upper portion and/or a lower portion of the active layer 12. For example, the clad layer may be implemented as an AlGaN layer or an InAlGaN layer. In addition, materials, such as AlGaN and AlInGaN, may also be used as (or included in) the active layer 12.

When an electric field having a reference voltage (e.g., a predetermined voltage) or greater is applied to both (e.g., opposite) ends of the light emitting element LD, the light emitting element LD emits light as electron-hole pairs are combined in the active layer 12.

The second semiconductor layer 13 is provided on the active layer 12 and may include a semiconductor layer of a type different from that of the first semiconductor layer 11. For example, the second semiconductor layer 13 may include at least one p-type semiconductor layer. For example, the second semiconductor layer 13 may include at least one semiconductor material, such as InAlGaN, GaN, AlGaN, InGaN, AlN, and InN, and may include a semiconductor layer doped with a second conductive dopant, such as Mg. However, the material included in the second semiconductor layer 13 is not limited thereto, and the second semiconductor layer 13 may be formed of various suitable materials.

According to an embodiment of the present invention, the light emitting element LD may additionally include a phosphor layer, another active layer, another semiconductor layer, and/or an electrode in an upper portion and/or a lower portion of each of the first semiconductor layer 11, the active layer 12, and the second semiconductor layer 13 as described above.

As an example, the light emitting element LD may further include at least one electrode disposed at one end side (e.g., an upper surface) of the second semiconductor layer 13 or at one end side (e.g., a lower surface) of the first semiconductor layer 11.

For example, referring to FIG. 1B, the light emitting element LD may further include an electrode 15 disposed at one end side of the second semiconductor layer 13. The electrode 15 may be an ohmic contact electrode but is not limited thereto. In some embodiments, the electrode 15 may be a Schottky contact electrode. In addition, the electrode 15 may include a metal or a metal oxide. For example, the electrode 15 may include chromium (Cr), titanium (Ti), aluminum (Al), gold (Au), nickel (Ni), ITO, and oxides or alloys thereof may be used alone or in combination, but the present invention is not limited thereto. In addition, in some embodiments, the electrode 15 may be substantially transparent or transflective. Accordingly, light generated by the light emitting element LD may pass through the electrode 15 and may be emitted to the outside of the light emitting element LD.

In addition, the light emitting element LD may further include an insulating film 14. However, in some embodiments, the insulating film 14 may be omitted, or the insulating film 14 may be provided to cover only some of (e.g., a portion of) the first semiconductor layer 11, the active layer 12, and the second semiconductor layer 13.

For example, the insulating film 14 may be provided at a portion other than both end portions of the light emitting element LD so that both end portions of the light emitting element LD are exposed (e.g., are exposed by or through the insulating film 14).

For convenience of description, FIGS. 1A and 1B illustrate structures in which a portion of the insulating film 14 is not shown (e.g., a portion of the insulating film 14 is shown in a cut-away view), but in practice, the insulating film 14 may surround (or extend around) an entire lateral surface of the light emitting element LD.

The insulating film 14 may be provided to partially surround outer circumferential surfaces of the first semiconductor layer 11, the active layer 12, and/or the second semiconductor layer 13. For example, the insulating film 14 may be provided to surround at least the outer circumferential surface of the active layer 12. In addition, when the light emitting element LD includes the electrode 15, the insulating film 14 may be provided to surround at least a portion of an outer circumferential surface of the electrode 15.

According to an embodiment of the present invention, the insulating film 14 may include a transparent insulating material. For example, the insulating film 14 may include one or more insulating materials selected from a group consisting of $SiO_2$, $Si_3N_4$, $Al_2O_3$, and $TiO_2$, but the insulating film 14 is not limited thereto. Various suitable insulating materials may be used for the insulating film 14.

When the insulating film 14 is provided on the light emitting element LD, the active layer 12 may not short-circuit with first and/or second electrodes, described in more detail below.

In addition, by forming the insulating film 14, a surficial defect of (e.g., a surface defect in) the light emitting element LD may be reduced or minimized, thereby improving lifetime and efficiency of the light emitting element LD. In addition, when a plurality of light emitting elements LD are closely disposed, the insulating film 14 may prevent (or reduce the occurrence of) undesirable short circuits between the light emitting elements LD.

The light emitting element LD described above may be used as a light emitting source of various display devices. For example, the light emitting element LD may be used as a light source element of a lighting device or a self-luminous display device.

Figure 2A:
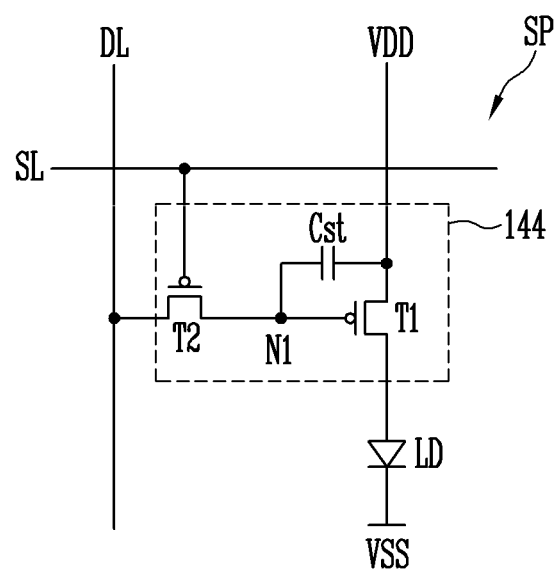
FIGS. 2A and 2B respectively illustrate circuit diagrams of a unit light emitting area of a display device according to an embodiment of the present invention.
Figure 2B:
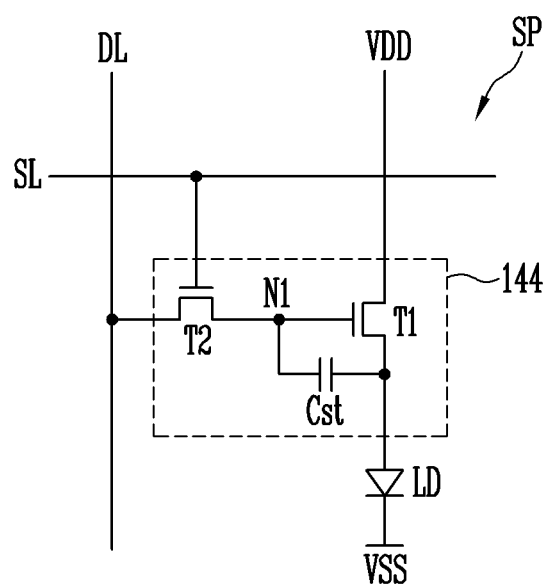

FIGS. 2A and 2B respectively illustrate circuit diagrams of a unit light emitting area of a display device according to an embodiment of the present invention. In more detail, FIGS. 2A and 2B respectively illustrate an example of a pixel of an active light emitting display panel. In an embodiment of the present invention, the unit light emitting area may be a pixel area in which one sub-pixel is provided (e.g., the unit light emitting area may be one sub-pixel).

Referring to FIG. 2A, a sub-pixel SP may include one or more light emitting elements LD and a pixel driving circuit 144 connected thereto to drive the light emitting elements LD.

A first electrode (e.g., an anode) of the light emitting element LD is connected to a first driving power source VDD via the pixel driving circuit 144, and a second electrode (e.g., a cathode) of the light emitting element LD is connected to a second driving power source VSS.

The first driving power source VDD and the second driving power source VSS may have different potentials. For example, the second driving power source VSS may have a low potential but which is greater than a threshold voltage of the light emitting elements LD, compared to a potential of the first driving power source VDD.

Each of the light emitting elements LD may emit light having a luminance corresponding to a driving current controlled by the pixel driving circuit 144.

Although FIG. 2A illustrates an embodiment in which only one light emitting element LD is included in the sub-pixel SP, the present invention is not limited thereto. For example, the sub-pixel SP may include a plurality of light emitting elements LD connected to each other in parallel.

According to an embodiment of the present invention, the pixel driving circuit 144 may include a first transistor T1, a second transistor T2, and a storage capacitor Cst. However, the structure of the pixel driving circuit 144 is not limited to the embodiments shown in FIGS. 2A and 2B.

A first electrode of the first transistor (e.g., a driving transistor) T1 is connected to the first driving power source VDD, and a second electrode thereof is electrically connected to the first electrode of each of the light emitting elements LD. A gate electrode of the first transistor T1 is connected to a first node N1. The first transistor T1 controls an amount of driving current supplied to the light emitting elements LD in response to a voltage at the first node N1.

A first electrode of the second transistor (e.g., a switching transistor) T2 is connected to a data line DL, and a second electrode thereof is connected to the first node N1. Here, the first and second electrodes of the second transistor T2 are different electrodes, and for example, when the first electrode is a source electrode, the second electrode may be a drain electrode. In addition, a gate electrode of the second transistor T2 is connected to a scan line SL.

The second transistor T2 is turned on when a scan signal having a voltage (e.g., a low voltage) at which the second transistor T2 may be turned on is supplied from the scan line SL to electrically connect the data line DL and the first node N1. In this case, a data signal of a corresponding frame is supplied to the data line DL, and thus, the data signal is transmitted to the first node N1. The data signal transmitted to the first node N1 is charged in the storage capacitor Cst.

One electrode of the storage capacitor Cst is connected to the first driving power source VDD, and the other electrode thereof is connected to the first node N1. The storage capacitor Cst charges a voltage corresponding to the data signal supplied to the first node N1 and maintains the charged voltage until a data signal of a next frame is supplied.

For convenience, the pixel driving circuit 144 shown in FIG. 2A is illustrated as having a relatively simple structure in which the second transistor T2 transmits the data signal inside the sub-pixel SP, the storage capacitor Cst stores the data signal, and the first transistor T1 supplying the driving current corresponding to the data signal to the light emitting element LD are provided.

However, the present invention is not limited thereto, and the structure of the pixel driving circuit 144 may be variously changed. For example, the pixel driving circuit 144 may additionally include at least one transistor element (e.g., at least one transistor), such as a transistor element for compensating a threshold voltage of the first transistor T1, a transistor element for initializing the first node N1, and/or a transistor element for controlling a light emitting time of the light emitting element LD, and the like, and other circuit elements, such as a boosting capacitor for boosting the voltage of the first node N1.

In addition, FIG. 2A illustrates the transistors included in the pixel driving circuit 144, for example, both the first transistor T1 and the second transistor T2, as p-type transistors, but the present invention is not limited thereto. That is, at least one of the first and second transistors T1 and T2 included in the pixel driving circuit 144 may be an n-type transistor.

Referring to FIG. 2B, according to an embodiment of the present invention, the first and second transistors T1 and T2 may be implemented as n-type transistors. A structure and/or operation of the pixel driving circuit 144 shown in FIG. 2B is similar to the structure and/or operation of the pixel driving circuit 144 shown in FIG. 2A except for changes to connection positions of some constituent elements (e.g., of the storage capacitor Cst) due to the different transistor type. Therefore, a detailed description thereof will be omitted.

Figure 3:
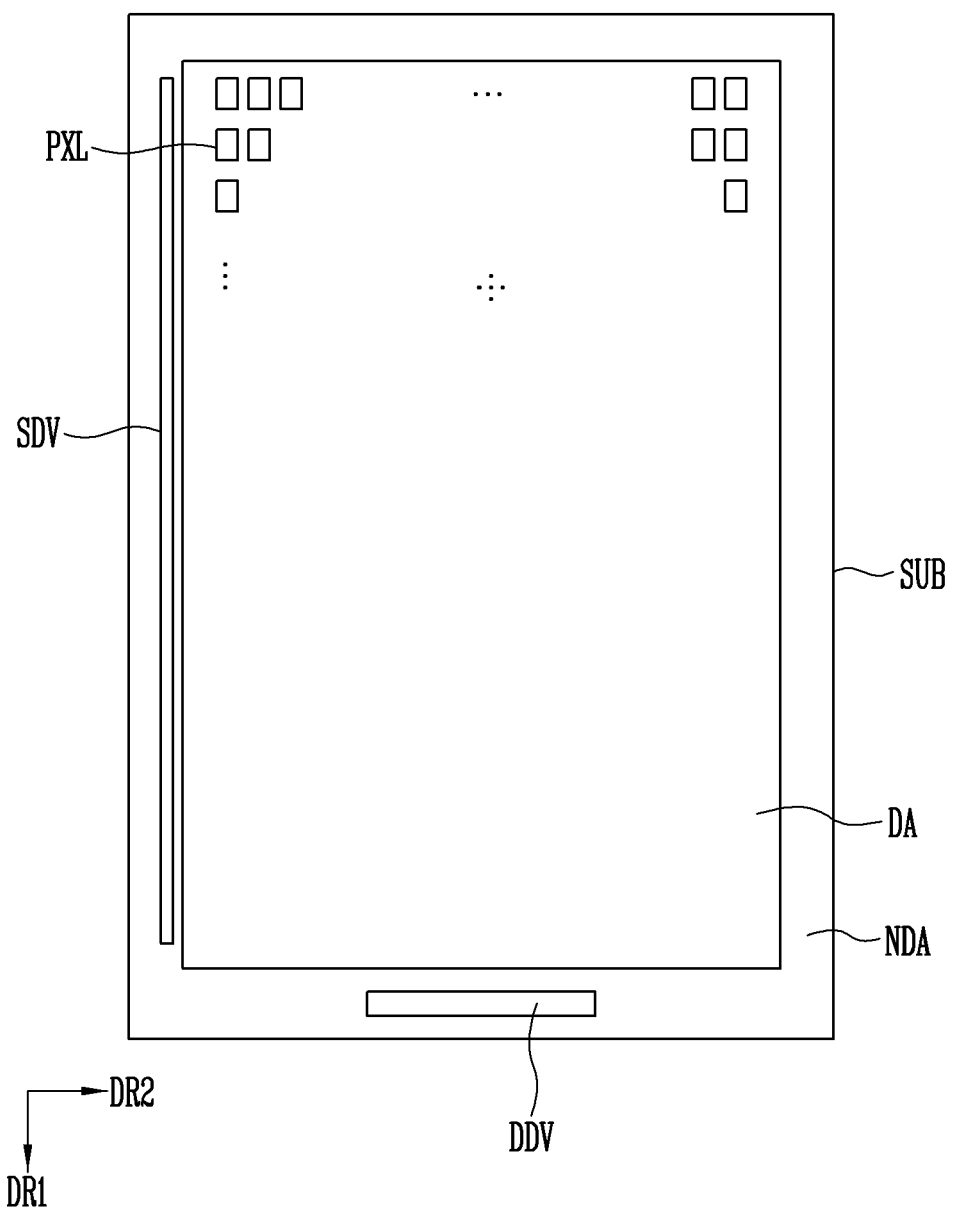
FIG. 3 illustrates a top plan view of a display device according to an embodiment of the present invention.

FIG. 3 illustrates a top plan view of a display device according to an embodiment of the present invention. Particularly, FIG. 3 is a schematic top plan view of a display device including the light emitting element LD shown in FIG. 1A or 1B as a light emitting source.

Referring to FIGS. 1A, 1B, and 3, the display device according to an embodiment of the present invention may include a substrate SUB, pixels PXL provided on one surface of the substrate SUB, a driver provided on the substrate SUB to drive the pixels PXL, and a wire part (e.g., a wiring) connecting the pixels PXL to the driver.

The display device may be a passive matrix display device or an active matrix display device according to a method of driving the light emitting elements LD. For example, when the display device is implemented as an active matrix display device, each of the pixels PXL may include a driving transistor for controlling an amount of current supplied to the light emitting element LD, a switching transistor for transmitting a data signal to the driving transistor, and the like.

The active matrix display device, in which each pixel PXL is selectively turned on, provides good resolution, contrast, and operation speed and, thus, has become mainstream. The present invention, however, is not limited thereto, and passive matrix display devices, in which light emission for each pixel group is performed, may also use constituent elements (e.g., first and second electrodes, described below) for driving the light emitting elements LD.

The substrate SUB may have a display area DA and a non-display area NDA. The display area DA may be an area in which the pixels PXL for displaying an image are provided. The non-display area NDA may be an area in which the driver for driving the pixels PXL and a portion of the wire part connecting the driver and the pixels PXL are provided.

The pixels PXL may be provided in the display area DA on the substrate SUB. Each of the pixels PXL may be provided in plural as a unit for displaying an image (e.g., the pixels PXL may correspond to sub-pixels such that a plurality of pixels PXL together form one light emitting unit). The pixels PXL may include a light emitting element LD that emits white light and/or color light. Each pixel PXL may emit one of red, green, and blue colors, but the present invention is not limited thereto. For example, each pixel PXL may emit one of cyan, magenta, yellow, and white colors.

A plurality of pixels PXL may be provided, and they may be arranged in a matrix form along a row extending in a first direction DR1 and a column extending in a second direction DR2 crossing (e.g., perpendicular to) the first direction DR1. However, the arrangement form (or configuration) of the pixels PXL is not particularly limited, and the pixels PXL may be arranged in various suitable forms.

The driver may provide a signal to each pixel PXL through the wire part and, thus, may control the driving of the pixels PXL. In FIG. 3, the wire part is not shown for convenience of description.

The driver may include a scan driver SDV that provides a scan signal to the pixels PXL through the scan line, a light emitting driver that provides a light emitting control signal to the pixels PXL through a light emitting control line, a data driver DDV that provides a data signal to the pixels PXL through the data line, and a timing controller. The timing controller may control the scan driver SDV, the light emitting driver, and the data driver DDV.

The display device according to an embodiment of the present invention may be applied to various electronic devices. For example, the display device may be applied to a television, laptop, mobile phone, smart phone, smart pad (PD), PMP, PDA, navigation device, various wearable devices, such as a smart watch, and the like.

Figure 4:
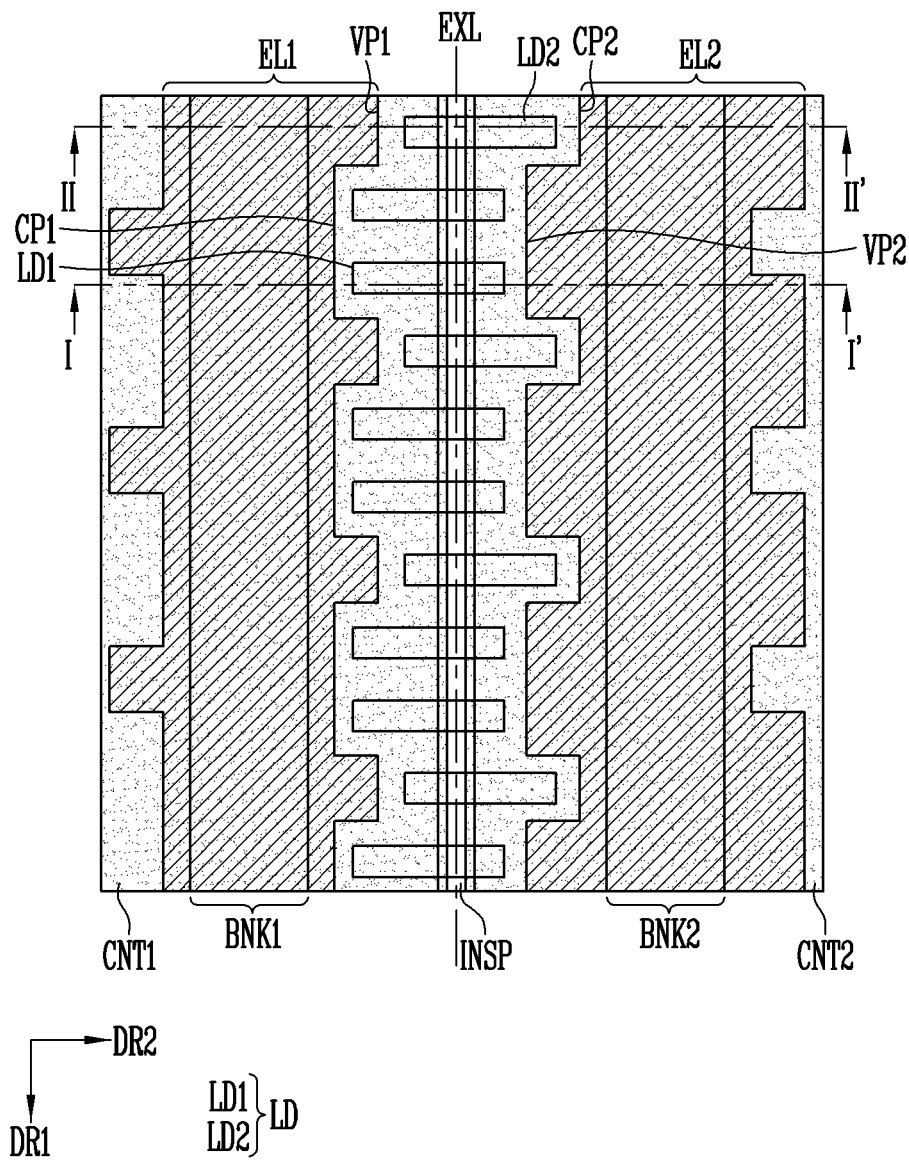
FIG. 4 illustrates a top plan view of a display element layer according to an embodiment of the present invention.
Figure 5A:
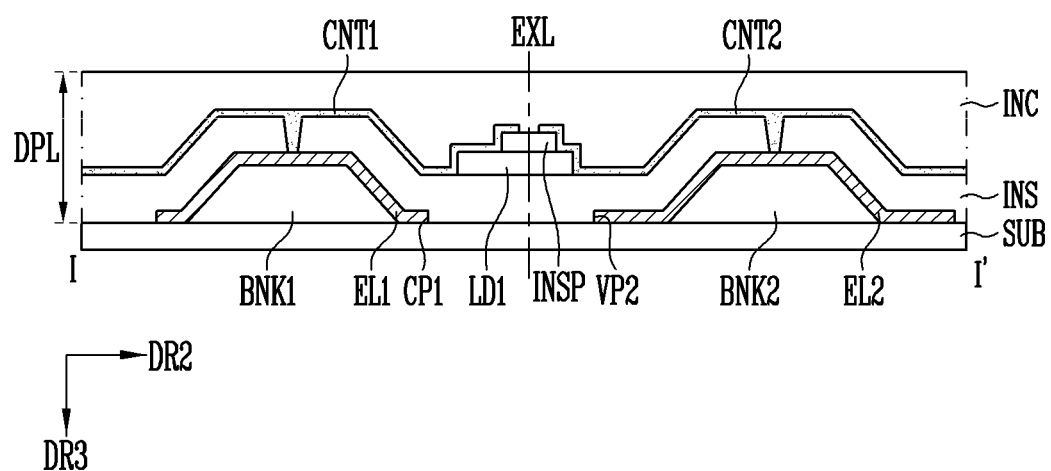
FIG. 5A illustrates a cross-sectional view taken along the line I-I' of FIG. 4.
Figure 5B:
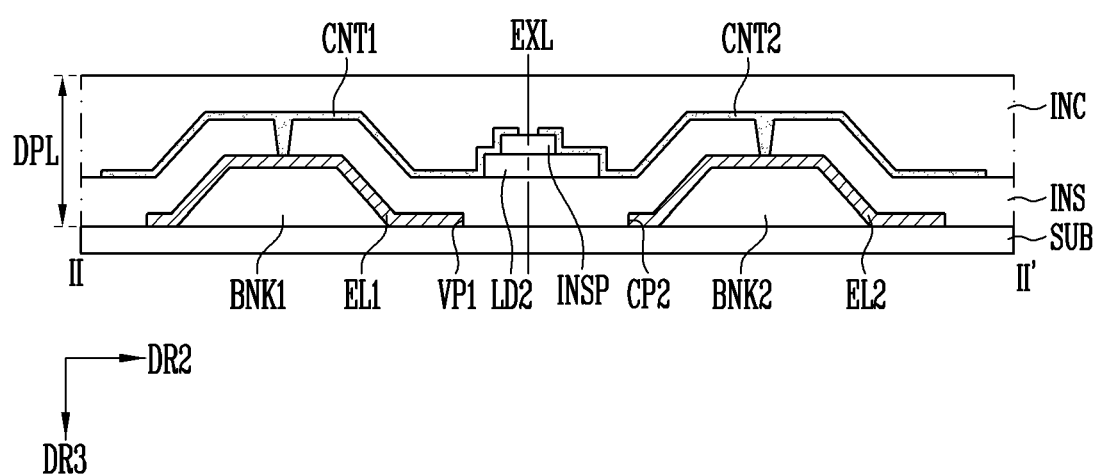
FIG. 5B illustrates a cross-sectional view taken along the line II-II' of FIG. 4.

FIG. 4 illustrates a top plan view of a display element layer according to an embodiment of the present invention, FIG. 5A illustrates a cross-sectional view taken along the line I-I' of FIG. 4, and FIG. 5B illustrates a cross-sectional view taken along the line II-II' of FIG. 4.

In FIG. 4, the light emitting elements LD are arranged in parallel along the second direction DR2, but the arrangement of the light emitting elements LD is not limited thereto. For example, the light emitting elements LD may be arranged to be inclined at an angle (e.g., a predetermined angle) with respect to the second direction DR2 between first and second electrodes EL1 and EL2.

As shown in FIGS. 4 to 5B, a display element layer DPL according to an embodiment of the present invention may include first and second banks BNK1 and BNK2 provided on the substrate SUB, the first and second electrodes EL1 and EL2, an insulating layer INS, the light emitting elements LD, an insulating pattern INSP, and first and second contact electrodes CNT1 and CNT2.

The substrate SUB may be a rigid substrate or a flexible substrate.

The rigid substrate may include (or may be) a glass substrate, a quartz substrate, a glass ceramic substrate, and/or a crystalline glass substrate.

The flexible substrate may include (or may be) a film substrate and/or a plastic substrate including an organic polymer material. For example, the flexible substrate may include one of polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC), and cellulose acetate propionate (CAP). In addition, the flexible substrate may include fiber glass reinforced plastic (FRP).

The substrate SUB (e.g., the material forming the substrate SUB) may have resistance (e.g., heat resistance) to a high processing temperatures during a manufacturing process of the display device. In various embodiments of the present invention, the substrate SUB may be flexible in whole or at least in part (e.g., the entire substrate SUB may be flexible or one or more portions of the substrate SUB may be flexible).

Figure 12:
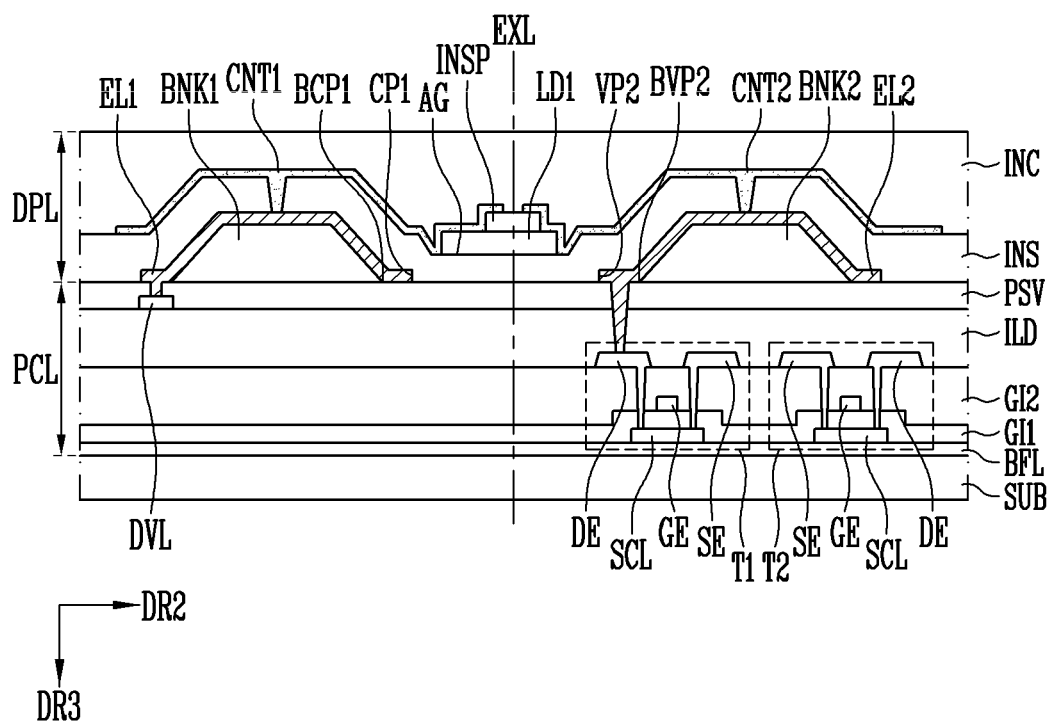
FIG. 12 illustrates a cross-sectional view of a display device according to an embodiment of the present invention.

The display element layer DPL may include a buffer layer provided on (e.g., formed on) the substrate SUB (see, e.g., FIG. 12). For example, the first and second banks BNK1 and BNK2, the first and second electrodes EL1 and EL2, the insulating layer INS, the light emitting elements LD, the insulating pattern INSP, and the first and second contact electrodes CNT1 and CNT2, which are described above, may be provided on the buffer layer.

The buffer layer may prevent or substantially prevent impurities from diffusing into the light emitting elements LD. The buffer layer may be a single layer but, in other embodiments, may be a multilayer including two or more layers. When the multilayer buffer layer is provided, respective layers may be formed of the same material or different materials. In some embodiments, the buffer layer may be omitted depending on the material of the substrate SUB and processing conditions.

The first electrode EL1 and the second electrode EL2 may be provided on the substrate SUB to extend along the first direction DR1 and to be spaced apart from each other along the second direction DR2. The light emitting elements LD may be electrically connected to the first and second electrodes EU and EL2.

As shown in FIGS. 4 to 5B, the first electrode EL1 may include a first convex portion VP1 that is convex toward the second electrode EL2 (e.g., the first convex portion VP1 may protrude in the positive second direction DR2 toward the second electrode EL2) and a first concave portion CP1 that is concave in a direction opposite to a direction in which the first convex portion VP1 protrudes, in a plan view (e.g., the first concave portion CP1 may be recessed in the negative second direction DR2 away from the second electrode EL2). Based on the second direction DR2, the first convex portion VP1 may protrude in a direction toward the second electrode EL2 from the first electrode EL1, and the first concave portion CP1 may be concave in a direction toward the first electrode EL1 from the second electrode EL2. The first convex portion VP1 and the first concave portion CP1 may be alternately arranged on the first electrode EL1 along the first direction DR1.

In addition, the second electrode EL2 may include a second convex portion VP2 that is convex toward the first electrode EU (e.g., the second convex portion VP2 may protrude in the negative second direction DR2 toward the first electrode EL1) and a second concave portion CP2 that is concave in a direction opposite to a direction in which the second convex portion VP2 protrudes, in a plan view (e.g., the second concave portion CP2 may be recessed in the positive second direction DR2 away from the first electrode EU). Based on the second direction DR2, the second convex portion VP2 may protrude in a direction toward the first electrode EL1 from the second electrode EL2, and the second concave portion CP2 may be concave in a direction toward the second electrode EL2 from the first electrode EL1. The second convex portion VP2 and the second concave portion CP2 may be alternately arranged on the second electrode EL2 along the first direction DR1.

The first convex portion VP1 and the first concave portion CP1 are alternately arranged along the first electrode EL1 in the first direction DR1, and the second convex portion VP2 and the second concave portion CP2 are alternately arranged along the second electrode EL2 in the first direction DR1. Thus, a degree of alignment of the light emitting elements LD may be improved between the first electrode EL1 and the second electrode EL2.

In an embodiment of the present invention, the first concave portion CP1 and the second concave portion CP2 may be alternately arranged along the first direction DR1, and the first convex portion VP1 and the second convex portion VP2 may be alternately arranged along the first direction DR1.

Referring to FIG. 4, the first convex portion VP1 may face the second concave portion CP2 (e.g., the first convex portion VP1 and the second concave portion CP2 may be aligned or substantially aligned with each other in the second direction DR2), and the second convex portion VP2 may face the first concave portion CP1 (e.g., the second convex portion VP2 and the first concave portion CP1 may be aligned or substantially aligned with each other in the second direction DR2).

FIG. 4 illustrates an embodiment in which shapes of the first concave portion CP1 and the second convex portion VP2 facing each other correspond to each other and shapes of the second concave portion CP2 and the first convex portion VP1 facing each other correspond to each other. However, in other embodiments, the shape of the first concave portion CP1 and the shape of the second convex portion VP2 may be different from each other, and the shape of the second concave portion CP2 and the shape of the first convex portion VP1 may be different from each other.

As shown in FIG. 4, when the first concave portion CP1 and the second convex portion VP2 face each other and an alignment signal (described in more detail below) is applied to the first and second electrodes EL1 and EL2, an electric field is concentrated between the first concave portion CP1 and the second convex portion VP2, and the light emitting elements LD may be effectively arranged between the first concave portion CP1 and the second convex portion VP2.

When an alignment signal (e.g., a predetermined alignment signal) is applied to the second electrode EL2, the electric field may be concentrated at the most protruding portion (e.g., the distal portion) of the second convex portion VP2. For example, the electric field may be concentrated at a corner portion of the second convex portion VP2.

When an alignment signal (e.g., a predetermined alignment signal) is applied to the first electrode EL1, the electric field may be concentrated at the most concave portion of the first concave portion CP1. For example, the electric field may be concentrated at a corner portion of the first concave portion CP1. In this case, the first concave portion CP1 may be positioned between adjacent first convex portions VP1 along the first direction DR1, and the electric field may be concentrated at the most protruding portion of the first convex portion VP1 adjacent to the first concave portion CP1.

Accordingly, when the alignment signal is applied to the first and second electrodes EL1 and EL2, a strong electric field is formed between the first concave portion CP1 and the second convex portion VP2 that face each other such that the light emitting elements LD may be effectively arranged between the first concave portion CP1 and the second convex portion VP2. In addition, because the electric field is concentrated between the first concave portion CP1 and the second convex portion VP2, the number of unarranged light emitting elements LD may be reduced. As a result, a loss of the light emitting elements LD (e.g., a number of unaligned and/or inoperative light emitting elements LD) may be reduced, and the number of light emitting elements LD (e.g., the number of aligned and/or operative light emitting elements LD) provided per unit area of the substrate SUB may be increased.

Because the second concave portion CP2 and the first convex portion VP1 face each other, when an alignment signal is applied to the first and second electrodes EL1 and EL2, an electric field is concentrated between the second concave portion CP2 and the first convex portion VP1 such that the light emitting elements may be effectively arranged between the second concave portion CP2 and the first convex portion VP1.

When the alignment signal is applied to the first electrode EL1, the electric field may be concentrated at the most protruding portion of the first convex portion VP1. For example, the electric field may be concentrated at a corner portion of the first convex portion VP1.

When an alignment signal (e.g., a predetermined alignment signal) is applied to the second electrode EL2, the electric field may be concentrated at the most concave portion of the second concave portion CP2. For example, the electric field may be concentrated at a corner portion of the second concave portion CP2. In this case, the second concave portion CP2 may be positioned between adjacent second convex portions VP2 along the first direction DR1, and the electric field may be concentrated at the most protruding portion of the second convex portion VP2 adjacent to the second concave portion CP2.

Accordingly, when the alignment signal is applied to the first and second electrodes EL1 and EL2, a strong electric field is formed between the second concave portion CP2 and the first convex portion VP1 that face each other such that the light emitting elements LD may be effectively arranged between the second concave portion CP2 and the first convex portion VP1.

In an embodiment of the present invention, the light emitting elements LD may be disposed between the first electrode EL1 and the second electrode EL2. As shown in FIGS. 4 to 5B, an imaginary extension line EXL extending in the first direction DR1 may be set between the first electrode EL1 and the second electrode EL2. The imaginary extension line EXL may pass through a half point between (e.g., may pass halfway between) the first bank BNK1 and the second bank BNK2 based on the second direction DR2. In other cases, the imaginary extension line EXL may be set to extend in the first direction DR1 along a central portion of the insulating pattern INSP.

The light emitting elements LD may include a first light emitting element LD1 disposed close to the first concave portion CP1 (e.g., aligned with the first concave portion CP1 in the second direction DR2) and a second light emitting element LD2 disposed close to the second concave portion CP2 (e.g., aligned with the second concave portion CP2 in the second direction DR2) based on the imaginary extension line EXL.

Based on the second direction DR2, one end portion of the first light emitting element LD1 may be positioned adjacent to the first concave portion CP1, and one end portion of the second light emitting element LD2 may be positioned adjacent to the second concave portion CP2. Referring to FIG. 4, in a plan view, one end portion of the first light emitting element LD1 may be accommodated in the first concave portion CP1 (e.g., may be arranged between adjacent ones of the first convex portions VP1 and aligned with the first concave portion CP1), and one end portion of the second light emitting element LD2 may be accommodated in the second concave portion CP2 (e.g., may be arranged between adjacent ones of the second convex portions VP2 and aligned with the second concave portion CP2).

In an embodiment of the present invention, the first light emitting element LD1 may be disposed between the first concave portion CP1 and the second convex portion VP2, and the second light emitting element LD2 may be disposed between the second concave portion CP2 and the first convex portion VP1.

As shown in FIGS. 4 to 5B, based on the second direction DR2, one end portion of the first light emitting element LD1 may be adjacent to the first concave portion CP1, and the other end portion thereof may be adjacent to the second convex portion VP2. In addition, based on the second direction DR2, one end portion of the second light emitting element LD2 may be adjacent to the second concave portion CP2, and the other end portion thereof may be adjacent to the first convex portion VP1.

In FIG. 4, it is illustrated that two first light emitting elements LD1 are disposed between the first concave portion CP1 and the second convex portion VP2, and one second light emitting element LD2 is disposed between the first convex portion VP1 and the second concave portion CP2, but the numbers of the first and second light emitting elements LD1 and LD2 is not limited thereto. For example, one first light emitting element LD1 may be disposed between the first concave portion CP1 and the second convex portion VP2, and two second light emitting elements LD2 may be disposed between the first convex portion VP1 and the second concave portion CP2. In addition, three or more first light emitting elements LD1 may be disposed between the first concave portion CP1 and the second convex portion VP2, and three or more second light emitting elements LD2 may be disposed between the first convex portion VP1 and the second concave portion CP2. The number of first light emitting elements LD1 disposed between the first concave portion CP1 and the second convex portion VP2 and the number of second light emitting elements LD2 disposed between the first convex portion VP1 and the second concave portion CP2 are variously set according to the resolution of the display device.

In various embodiments of the present invention, the display element layer DPL may include the first and second banks BNK1 and BNK2 provided on the substrate SUB.

As shown in FIG. 4, the first and second banks BNK1 and BNK2 may be provided on the substrate SUB to extend along the first direction DR1 and may be spaced apart from each other along the second direction DR2. The first and second banks BNK1 and BNK2 may partition the unit light emitting areas.

The first and second banks BNK1 and BNK2, which are adjacent to each other on the substrate SUB, may be spaced apart from each other along the second direction DR2. For example, two first and second banks BNK1 and BNK2 adjacent to each other on the substrate SUB may be spaced apart by more than a length of the light emitting element LD.

The first and second banks BNK1 and BNK2 may include an inorganic insulating film made of an inorganic material or an organic insulating film made of an organic material. In some embodiments, the first and second banks BNK1 and BNK2 may be a single-layer (or single-film) organic insulating film and/or a single-layer (or single-film) inorganic insulating film, but the present invention is not limited thereto. In some embodiments, the first and second banks BNK1 and BNK2 may be multi-layer films in which at least one or more organic insulating films and at least one or more inorganic insulating films are stacked on each other. However, the materials of the first and second banks BNK1 and BNK2 are not limited to those of the above-described embodiments, and in some embodiments, the first and second banks BNK1 and BNK2 may include a conductive material.

The banks BNK1 and BNK2 may have a trapezoidal cross-section having a width that becomes narrower toward an upper portion thereof along a third direction DR3, but the banks BNK1 and BNK2 are not limited thereto. As another example, the banks BNK1 and BNK2 may have a curved surface, such as a semi-circle or semi-ellipse, with a cross-section having a width that becomes narrower toward an upper portion thereof. In the present invention, a shape and/or a slope of the banks BNK1 and BNK2 are not particularly limited, and they may be variously, suitably changed.

A bank pattern may be provided in a peripheral area of the pixel area of each pixel PXL.

The bank pattern may surround (or may extend around) at least one side of the peripheral area included in the pixel area of each of the pixels PXL. The bank pattern is a structure that respectively defines (or partitions) light emitting areas of each pixel PXL and the pixels PXL adjacent to the pixel PXL, and for example, the bank pattern may be a pixel defining layer. The bank pattern may be configured to include at a light blocking material and/or a reflective material to prevent or substantially prevent light leakage from occurring within each pixel PXL and between adjacent pixels PXL. In some embodiments, a reflective material layer may be formed on the bank pattern to further improve light emission (or light extraction) efficiency of each pixel PXL. In some embodiments, the bank pattern may be formed in a layer different from or in the same layer as the first and second banks BNK1 and BNK2.

Referring to FIGS. 4 to 5B, the first electrode EL1 may be provided on the first bank BNK1, and the second electrode EL2 may be provided on the second bank BNK2. In this case, the first electrode EL1 may have a shape corresponding to an inclination of the first bank BNK1, and the second electrode EL2 may have a shape corresponding to an inclination of the second bank BNK2. For example, each of the first and second electrodes EU and EL2 may include a protruding portion corresponding to the first and second banks BNK1 and BNK2 and a flat portion corresponding to the substrate SUB.

In various embodiments of the present invention, the first electrode EL1 and the second electrode EL2 may be reflective electrodes. When the first and second electrodes EL1 and EL2 are reflective electrodes, they may guide light emitted from the light emitting elements LD in a direction from the substrate SUB toward the display element layer DPL (e.g., in a front surface direction).

Each of the first and second banks BNK1 and BNK2 and the first and second electrodes EL1 and EL2 may act as a reflective member that guides light emitted by the light emitting elements LD in a desired direction to improve light efficiency of the display device. For example, each of the first and second banks BNK1 and BNK2 and the first and second electrodes EL1 and EL2 may act as a reflective member to improve light emitting efficiency of the light emitting elements LD by directing the light emitted from the light emitting elements LD in a front surface direction of the display device (e.g., in an image display direction).

When the first electrode EL1 and the second electrode EL2 are reflective electrodes, they may include a conductive material having high light reflectivity. Examples of the conductive material having the high light reflectivity include metals, such as Ag, Mg, Al, Pt, Pd, Au, Ni, Nd, Ir, Cr, Ti, and alloys thereof.

In some embodiments, each of the first and second electrodes EL1 and EL2 may include a transparent conductive material. The transparent conductive material may include a conductive oxide, such as indium tin oxide (ITO), indium zinc oxide (IZO), zinc oxide (ZnO), and indium tin zinc oxide (ITZO), a conductive polymer, such as PEDOT, and/or the like. When each of the first and second electrodes EL1 and EL2 includes the transparent conductive material, a separate conductive layer made of (or including) an opaque metal for reflecting light emitted from the light emitting elements LD in the front surface direction (e.g., the image display direction) of the display device may be additionally included. However, the material of each of the first and second electrodes EL1 and EL2 is not limited to the materials described above.

In various embodiments of the present invention, the display element layer DPL may include the insulating layer INS covering the first and second electrodes EL1 and EL2. For example, the insulating layer INS may be provided on one surface of the substrate SUB on which the first and second banks BNK1 and BNK2 and the first and second electrodes EL1 and EL2 are provided. Because the first and second electrodes EL1 and EL2 are covered by the insulating layer INS, the first and second electrodes EL1 and EL2 may not be affected by static electricity introduced from the outside.

The insulating layer INS may include an organic insulating film, an inorganic insulating film, or an organic insulating film disposed on an inorganic insulating film. The inorganic insulating film may include at least one of a metal oxide, such as a silicon oxide ($SiO_x$), a silicon nitride ($SiN_x$), a silicon oxynitride (SiON), and aluminum oxide ($AlO_x$). The organic insulating film may include an organic insulating material capable of transmitting light. The organic insulating film may be, for example, at least one of a polyacrylates resin, an epoxy resin, a phenolic resin, a polyamide resin, a polyimide resin, an unsaturated polyester resin, a poly-phenylen ether resin, a polyphenylene sulfide resin, and a benzocyclobutene resin.

In various embodiments of the present invention, the insulating layer INS may be formed as (or may include) an inorganic insulating film that protects the light emitting elements LD from the pixel circuit layer of each pixel PXL, but the present invention is not limited thereto. In some embodiments, the insulating layer INS may be formed as (or may include) an organic insulating film that flattens (e.g., planarizes) support surfaces of the light emitting elements LD.

The light emitting elements LD may be disposed on the insulating layer INS between the first electrode EL1 and the second electrode EL2. For example, the light emitting elements LD may be provided on a different layer than the first and second electrodes EL1 and EL2. In an embodiment of the present invention, a length of each of the light emitting elements LD (see 'L' in FIGS. 1A and 1B) may be about 1 µm to about 10 µm. For example, the length L of each of the light emitting elements LD may be about 3.5 µm to about 4.5 µm, but the present invention is not necessarily limited thereto, and the length L and a diameter (see 'D' in FIG. 1A and FIG. 1B) thereof may be varied to meet requirements of the display device to which the light emitting elements LD are to be applied.

When the length L of each light emitting element LD is about 3.5 µm to 4.5 µm, an interval (or region) between the first electrode EL1 and the second electrode EL2 provided at where the light emitting elements LD are arranged may be the same as or greater than the length L of each light emitting element LD. For example, an interval between the first convex portion VP1 of the first electrode EL1 and the second concave portion CP2 of the second electrode EL2 may be the same as or about 0.5 µm greater than the length L of each light emitting element LD.

In an embodiment of the present invention, "formed and/or provided on the same layer" means formed in (or during) the same process, and "formed and/or provided on another layer" means formed in (or during) a different process.

As shown in FIGS. 4 to 5B, the display element layer DPL may include the insulating pattern INSP provided on the light emitting elements LD. The insulating pattern INSP may prevent or substantially prevent the light emitting elements LD, which are disposed between the first and second electrodes EL1 and EL2, from moving from the arranged positions.

The insulating pattern INSP may be provided to extend along the first direction DR1. The insulating pattern INSP may partially overlap the light emitting elements LD to expose one end portion and the other end portion of the light emitting elements LD. The insulating pattern INSP may be made of a transparent insulating material so that light emitted from the light emitting elements LD may be transmitted therethrough without loss or without substantial loss.

The insulating pattern INSP may be formed as a single film or as a multifilm (e.g., as a multi-layer film) and may include an inorganic insulating film including at least one inorganic material or an organic insulating film including at least one organic material. The insulating pattern INSP may further fix each of the light emitting elements LD arranged in the light emitting area of each pixel PXL.

In an embodiment of the present invention, the insulating pattern INSP may include an inorganic insulating film that protects the active layer 12 of each of the light emitting elements LD from oxygen and moisture from the outside. However, the present invention is not limited thereto. The insulating pattern INSP may include an organic insulating film including an organic material according to design conditions of the display device to which the light emitting elements LD are applied.

When an empty gap (or space) exists between the insulating layer INS and the light emitting elements LD along the third direction DR3 before formation of the insulating pattern INSP, the empty gap may be filled with the insulating pattern INSP in a process of forming the insulating pattern INSP. Accordingly, the insulating pattern INSP may be formed as an organic insulating film that may fill an empty gap between the insulating layer INS and the light emitting elements LD.

In various embodiments of the present invention, the display element layer DPL may include the first contact electrode CNT1 that electrically connects the first electrode EL1 to the light emitting elements LD and the second contact electrode CNT2 that electrically connects the second electrode EL2 to the light emitting elements LD.

As shown in FIGS. 5A and 5B, the first and second contact electrodes CNT1 and CNT2 and the light emitting elements LD may be provided on the insulating layer INS. The first contact electrode CNT1 and the first electrode EL1 may be connected to each other through a contact opening (e.g., a contact hole) penetrating the insulating layer INS, and the second contact electrode CNT2 and the second electrode EL2 may be connected to each other through another contact opening (e.g., another contact hole) penetrating the insulating layer INS.

In FIGS. 5A and 5B, the first and second contact electrodes CNT1 and CNT2 are shown as being provided in the same layer on the insulating layer INS, but in other embodiments, the first and second contact electrodes CNT1 and CNT2 may be provided in different layers from each other. When the first contact electrode CNT1 and the second contact electrode CNT2 are provided in different layers, a separate insulating film may be disposed between the first contact electrode CNT1 and the second contact electrode CNT2.

The first contact electrode CNT1 may be provided at one end portion of the light emitting element LD exposed by the insulating pattern INSP, and the second contact electrode CNT2 may be provided at the other end portion thereof. Through this, the light emitting elements LD may be electrically connected to the first and second electrodes EL1 and EL2.

In addition, the first and second contact electrodes CNT1 and CNT2 may also be provided on the insulating pattern INSP. For example, the first contact electrode CNT1 and the second contact electrode CNT2 may be spaced apart from each other on the insulating pattern INSP. As the first and second contact electrodes CNT1 and CNT2 are provided on the insulating pattern INSP, the positions of the light emitting elements LD arranged between the first and second electrodes EL1 and EL2 may be more stably fixed.

The first and second contact electrodes CNT1 and CNT2 include at least one of various suitable transparent conductive materials and/or may include ITO, IZO, and ITZO and may be implemented to be substantially transparent or transflective to satisfy a reference light transmittance (e.g., a predetermined light transmittance). However, the materials of the first and second contact electrodes CNT1 and CNT2 are not limited to those of the above-described embodiments, and in some embodiments, the first and second contact electrodes CNT1 and CNT2 may be made of various suitable opaque conductive materials.

The first and second contact electrodes CNT1 and CNT2 may be made of (or may include) a transparent conductive material so that light emitted from each of the light emitting elements LD may be transmitted without loss or without substantial loss.

In various embodiments of the present invention, an area of the first contact electrode CNT1 overlapping the first light emitting element LD1 may be greater than an area of the second contact electrode CNT2 overlapping the first light emitting element LD1. As shown in FIG. 4 and FIG. 5A, the first light emitting elements LD1 may be provided close to the first concave portion CP1 based on the imaginary extension line EXL. Accordingly, an area at where the first contact electrode CNT1 covers one end portion of the first light emitting element LD1 may be larger than an area at where the second contact electrode CNT2 covers the other end portion of the first light emitting element LD1.

In various embodiments of the present invention, an area of the first contact electrode CNT1 overlapping the second light emitting element LD2 may be smaller than an area of the second contact electrode CNT2 overlapping the second light emitting element LD2.

As shown in FIG. 4 and FIG. 5B, the second light emitting elements LD2 may be provided close to the second concave portion CP2 based on the imaginary extension line EXL. Accordingly, an area at where the first contact electrode CNT1 covers one end portion of the second light emitting element LD2 may be smaller than an area at where the second contact electrode CNT2 covers the other end portion of the second light emitting element LD2.

In various embodiments of the present invention, the first and second banks BNK1 and BNK2, the first and second electrodes EL1 and EL2, the light emitting elements LD, the insulating pattern INSP, and the first and second contact electrodes CNT1 and CNT2, which are described above, may be provided to each of the pixels PXL.

In various embodiments of the present invention, the display element layer DPL may include an encap layer (e.g., an encapsulation layer) INC provided on one surface of the substrate SUB on which the first and second electrodes EL1 and EL2, the first and second contact electrodes CNT1 and CNT2, and the light emitting elements LD are provided. The encap layer INC may cover the first and second electrodes EL1 and EL2, the first and second contact electrodes CNT1 and CNT2, and the light emitting elements LD so as not to be exposed to the outside, thereby preventing or substantially preventing them from corroding. The encap layer INC may include a transparent insulating material to transmit light. The transparent insulating material may include an organic material and/or an inorganic material. For example, the encap layer INC may be made of (or may include) a transparent conductive material, such as IZO, to reduce or minimize loss of light that is emitted from the light emitting elements LD and reflected by the first and second electrodes EL1 and EL2 in the image display direction of the display device.

In various embodiments of the present invention, an overcoat layer may be provided on the encap layer INC. The overcoat layer may be an encapsulation layer that prevents or substantially prevents oxygen, moisture, and the like from penetrating into the light emitting elements LD.

Figure 6:
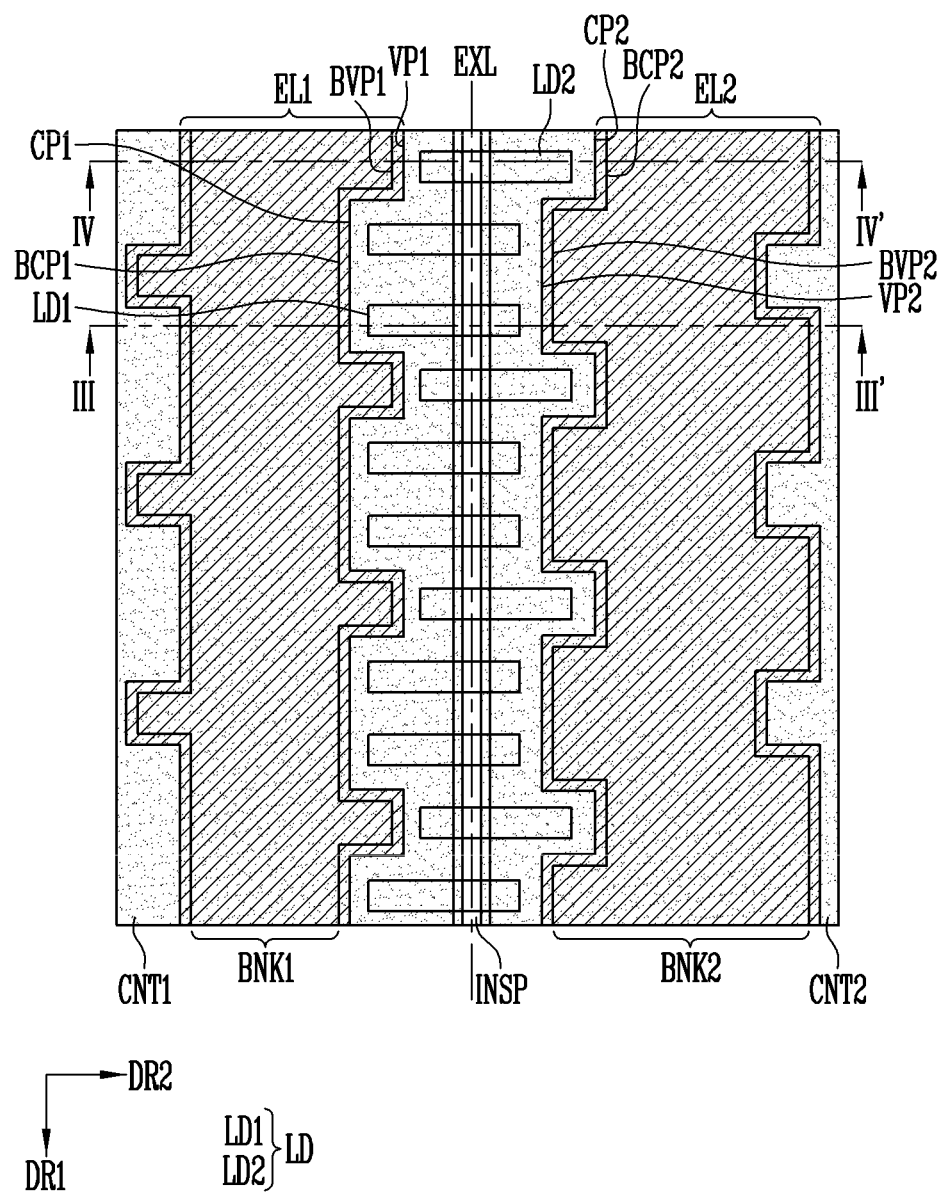
FIG. 6 illustrates a top plan view of a display element layer according to another embodiment of the present invention.

FIG. 6 illustrates a top plan view of a display element layer according to another embodiment of the present invention. Particularly, FIG. 6 illustrates a top plan view of an embodiment of the display element layer DPL in which the first and second electrodes EL1 and EL2 are provided in a form corresponding to the shapes of the first and second banks BNK1 and BNK2.

Figure 7A:
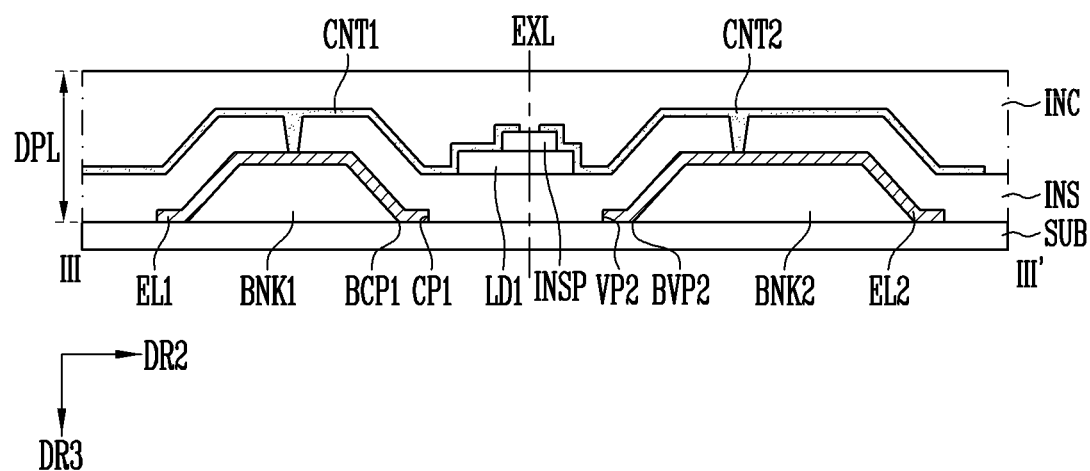
FIG. 7A illustrates a cross-sectional view taken along the line III-Ill' of FIG. 6.
Figure 7B:
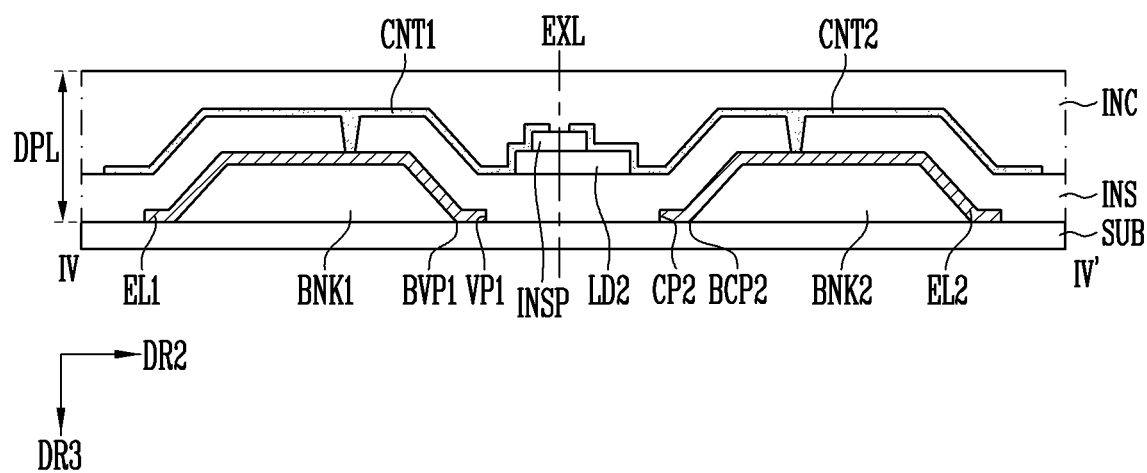
FIG. 7B illustrates a cross-sectional view taken along the line IV-IV' of FIG. 6.

FIG. 7A illustrates a cross-sectional view taken along the line III-III' of FIG. 6, and FIG. 7B illustrates a cross-sectional view taken along the line IV-IV' of FIG. 6.

In the display device according to the illustrated embodiment, a configuration that is not described in or is different from that of the display device according to the above-described embodiment will be primarily described to avoid duplicate descriptions. Parts and/or configurations not specifically described in the illustrated embodiment refer to (e.g., are substantially similar to or the same as in) the embodiment described above, the same reference numerals designate the same constituent elements, and similar reference numerals designate similar constituent elements. This is also applied to embodiments described further below.

As shown in FIGS. 6 to 7B, the display element layer DPL according to an embodiment of the present invention may include the first and second banks BNK1 and BNK2 provided on the substrate SUB, the first and second electrodes EL1 and EL2, the insulating layer INS, the light emitting elements LD, the insulating pattern INSP, and the first and second contact electrodes CNT1 and CNT2.

In an embodiment of the present invention, the first bank BNK1 may include a first bank convex portion BVP1 that is convex toward (e.g., protrudes toward) the second bank BNK2 and a first bank concave portion BCP1 that is concave (e.g., is recessed) in a direction opposite to a direction in which the first bank convex portion BVP1 protrudes, in a plan view. Based on the second direction DR2, the first bank convex portion BVP1 may protrude in a direction from the first bank BNK1 toward the second bank BNK2, and the first bank concave portion BCP1 may be provided to be concave in a direction from the second bank BNK2 toward the first bank BNK1. The first bank convex portion BVP1 and the first bank concave portion BCP1 may be alternately arranged in the first bank BNK1 along the first direction DR1.

In addition, the second bank BNK2 may include a second bank convex portion BVP2 that is convex toward (e.g., protrudes toward) the first bank BNK1 and a second bank concave portion BCP2 that is concave (e.g., is recessed) in a direction opposite to a direction in which the second bank convex portion BVP2 protrudes, in a plan view. Based on the second direction DR2, the second bank convex portion BVP2 may protrude in a direction from the second bank BNK2 toward the first bank BNK1, and the second bank concave portion BCP2 may be provided to be concave in a direction from the first bank BNK1 toward the second bank BNK2. The second bank convex portion BVP2 and the second bank concave portion BCP2 may be alternately arranged in the second bank BNK2 along the first direction DR1.

As shown in FIG. 6, the first bank concave portion BCP1 and the second bank concave portion BCP2 may be alternately arranged along the first direction DR1, and the first bank convex portion BVP1 and the second bank convex portion BVP2 may be arranged along the first direction DR1. In addition, the first bank convex portion BVP1 may face the second bank concave portion BCP2 (e.g., the first bank convex portion BVP1 may be aligned with or substantially aligned with the second bank concave portion BCP2 in the second direction DR2), and the second bank convex portion BVP2 may face the first bank concave portion BCP1 (e.g., the second bank convex portion BVP2 may be aligned with or substantially aligned with the first bank concave portion BCP1 in the second direction DR2).

In an embodiment of the present invention, in a plan view, the shape of the first electrode EL1 may correspond to the shape of the first bank BNK1, and the shape of the second electrode EL2 may correspond to the shape of the second bank BNK2. Referring to FIGS. 6 to 7B, the first electrode EL1 may be provided on the first bank BNK1, and the second electrode EL2 may be provided on the second bank BNK2.

The first electrode EL1 may be provided on the first bank BNK1 so that the first convex portion VP1 overlaps the first bank convex portion BVP1 and has a shape corresponding to a planar shape of the first bank convex portion BVP1, and the first concave portion CP1 overlaps the first bank concave portion BCP1 and has a shape corresponding to a planar shape of the first bank concave portion BCP1.

The second electrode EL2 may be provided on the second bank BNK2 so that the second convex portion VP2 overlaps the second bank convex portion BVP2 and has a shape corresponding to a planar shape of the second bank convex portion BVP2, and the second concave portion CP2 overlaps the second bank concave portion BCP2 and has a shape corresponding to a planar shape of the second bank concave portion BCP2.

In an embodiment of the present invention, the light emitting elements LD may include a first light emitting element LD1 disposed close to the first concave portion CP1 and the first bank concave portion BCP1 based on the imaginary extension line EXL, and a second light emitting element LD2 disposed close to the second concave portion CP2 and the second bank concave portion BCP2.

As shown in FIGS. 6 to 7B, one end portion of the first light emitting element LD1 may be positioned adjacent to the first concave portion CP1 and the first bank concave portion BCP1 based on the second direction DR2, and one end portion of the second light emitting elements LD2 may be positioned adjacent to the second concave portion CP2 and the second bank concave portion BCP2. Referring to FIG. 6, in a plan view, one end portion of the first light emitting element LD1 may be accommodated in the first concave portion CP1 and the first bank concave portion BCP1, and one end portion of the second light emitting element LD2 may be accommodated in the second concave portion CP2 and the second bank concave portion BCP2.

In an embodiment of the present invention, the first light emitting element LD1 may be disposed between the first concave portion CP1 and the second convex portion VP2. For example, the first light emitting element LD1 may be positioned between the first bank concave portion BCP1 and the second bank convex portion BVP2. In addition, the second light emitting element LD2 may be disposed between the second concave portion CP2 and the first convex portion VP1. For example, the second light emitting element LD2 may be positioned between the second bank concave portion BCP2 and the first bank convex portion BVP1.

As shown in FIGS. 6 to 7B, one end portion of the first light emitting element LD1 may be adjacent to the first concave portion CP1 and the first bank concave portion BCP1 based on the second direction DR2, and the other end portion thereof may be adjacent to the second convex portion VP2 and the second bank convex portion BVP2 based on the second direction DR2. In addition, one end portion of the second light emitting element LD2 may be adjacent to the second concave portion CP2 and the second bank concave portion BCP2 based the second direction DR2, and the other end portion thereof may be adjacent to the first convex portion VP1 and the first bank convex portion BVP1 based on the second direction DR2.

Figure 8:
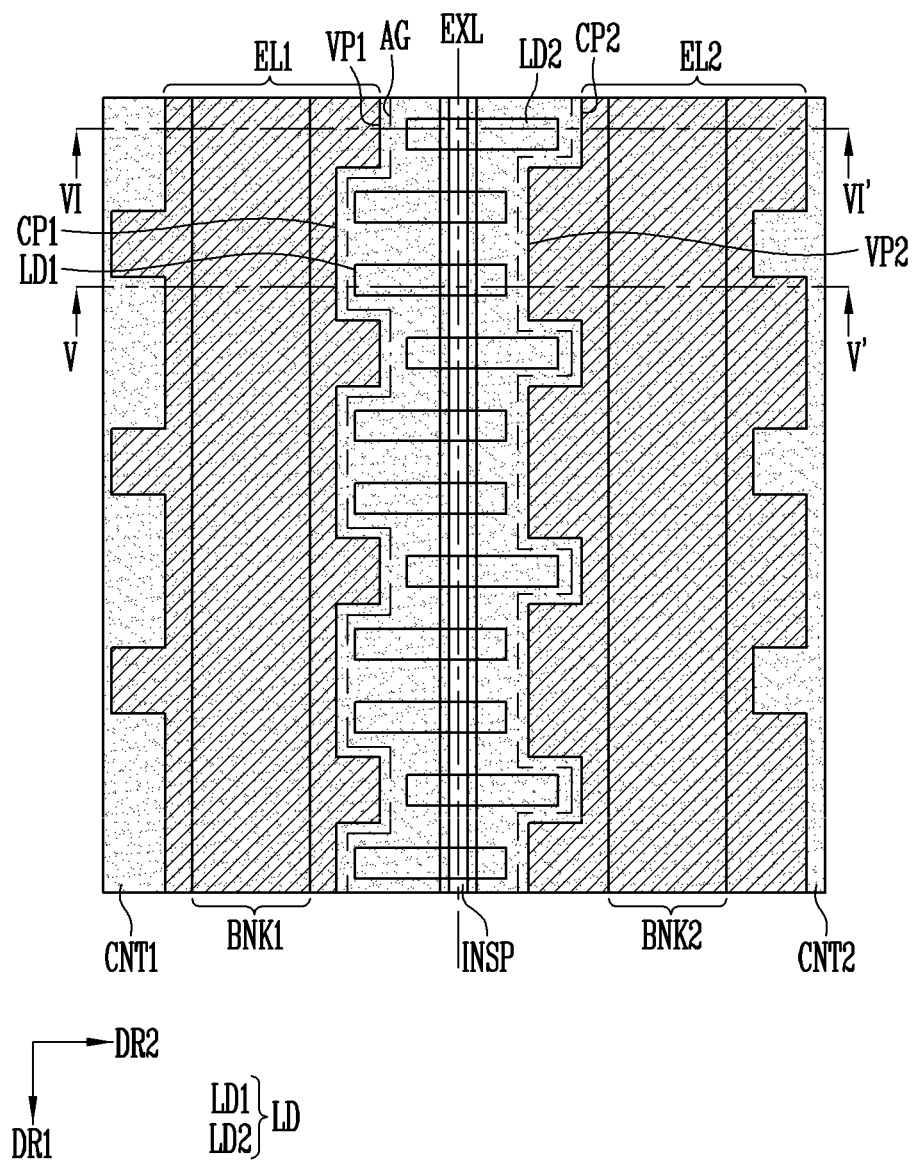
FIG. 8 illustrates a top plan view of a display element layer according to another embodiment of the present invention.
Figure 9A:
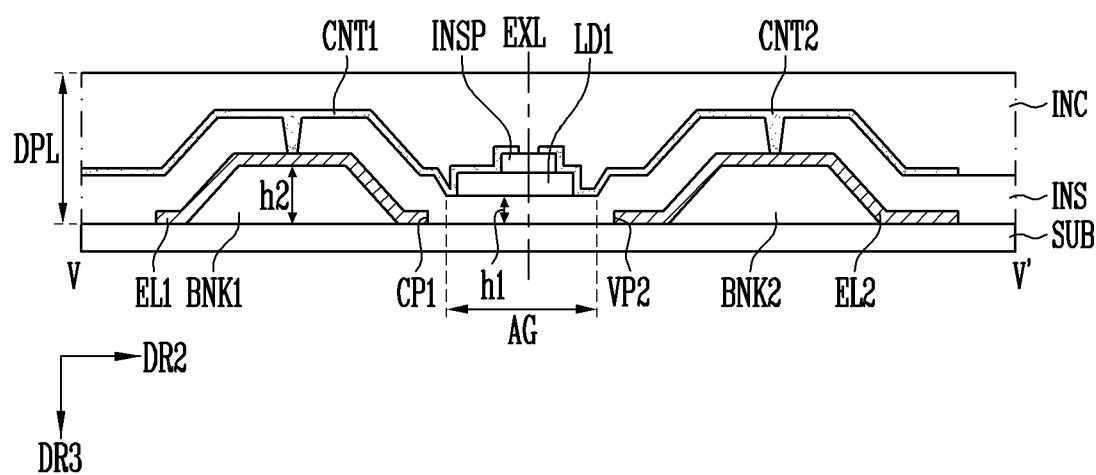
FIG. 9A illustrates a cross-sectional view taken along the line V-V' of FIG. 8.
Figure 9B:
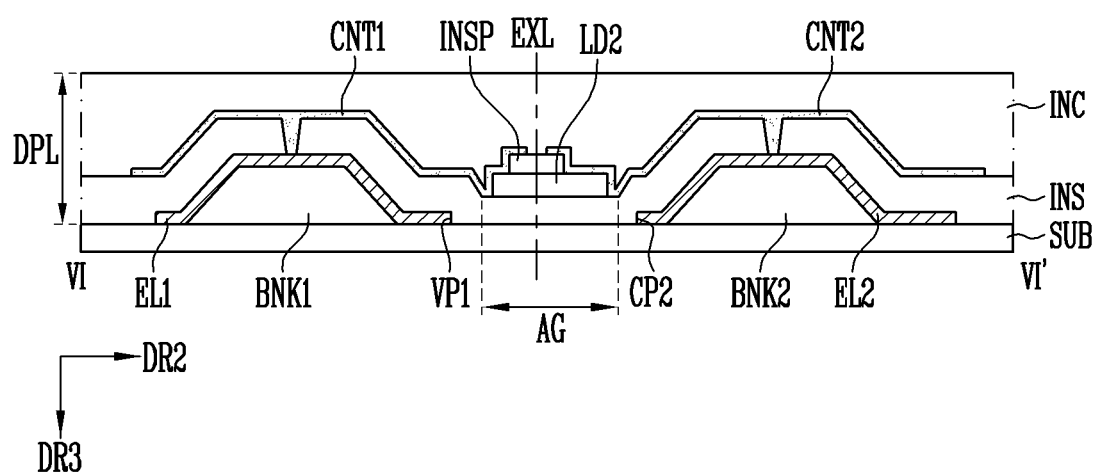
FIG. 9B illustrates a cross-sectional view taken along the line VI-VI' of FIG. 8.

FIG. 8 illustrates a top plan view of a display element layer according to another embodiment of the present invention, FIG. 9A illustrates a cross-sectional view taken along the line V-V' of FIG. 8, and FIG. 9B illustrates a cross-sectional view taken along the line VI-VI' of FIG. 8. Particularly, FIG. 9A and FIG. 9B respectively illustrate cross-sectional views of an embodiment of a display element layer DPL including an insulating layer INS in which an accommodating portion AG is formed.

As shown in FIGS. 8 to 9B, the display element layer DPL according to an embodiment of the present invention may include the first and second banks BNK1 and BNK2 provided on the substrate SUB, the first and second electrodes EL1 and EL2, the insulating layer INS, the light emitting elements LD, the insulating pattern INSP, and the first and second contact electrodes CNT1 and CNT2.

In an embodiment of the present invention, the accommodating portion AG of the insulating layer INS may be recessed in the third direction DR3 toward the substrate SUB from the display element layer DPL and may be disposed between the first electrode EL1 and the second electrode EL2. The light emitting elements LD may be disposed on the accommodating portion AG between the first electrode EU and the second electrode EL2.

In FIG. 8, the accommodating part AG is illustrated as being continuously disposed between the first electrode EL1 and the second electrode EL2 along the first direction DR1, but the shape of the accommodating portion AG is not limited thereto. For example, in other embodiments, the accommodating portion AG may include sub accommodating portions spaced apart from each other along the first direction DR1. In such an embodiment, a first sub-accommodating portion may be disposed between the first convex portion VP1 and the second concave portion CP2, a second sub-accommodating portion may be disposed between the first concave portion CP1 and the second convex portion VP2, and the first and second sub accommodating portions may be spaced apart from each other along the first direction DR1.

As shown in FIGS. 9A and 9B, a thickness of the insulating layer INS at the accommodating portion AG may be thinner than other portions of the insulating layer INS. For example, the insulating layer INS may have a thickness gradient between the first electrode EL1 and the second electrode EL2.

By forming the accommodating portion AG between the first electrode EL1 and the second electrode EL2, the light emitting elements LD may be more effectively arranged between the first electrode EL1 and the second electrode EL2. For example, by providing the accommodating portion AG in the insulating layer INS between the first electrode EL1 and the second electrode EL2, the light emitting elements LD may be stably positioned (e.g., pre-positioned) in the accommodating portion AG during a process in which the light emitting elements LD are arranged. As a result, a number of unarranged light emitting elements LD remaining on the first and second banks BNK1 and BNK2 may be reduced and more light emitting elements LD may be arranged between the first and second electrodes EL1 and EL2.

In an embodiment of the present invention, a thickness h1 of the insulating layer INS at the accommodating portion AG in the third direction DR3 may be less than or equal to half the thicknesses h2 of the first and second banks BNK1 and BNK2 in the third direction DR3. Referring to FIG. 9A, the insulating layer INS at the accommodating portion AG may have the thickness h1 in the third direction DR3.

Generally, the thickness h1 of the insulating layer INS at the accommodating portion AG is determined based on the thickness of the first bank BNK1, but it may be determined according to a deposition thickness of the insulating layer INS and a progress degree (e.g., an etching depth) of an etching process for forming the accommodating portion AG. For example, the thickness h1 of the insulating layer INS at the accommodating portion AG may be about 1.5 μm to about 2 μm, but the present invention is not necessarily limited thereto. In some embodiments, the accommodating portion AG may be below an upper surface of the first bank BNK1 in order to improve a reflectivity of the light emitted from each light emitting element LD provided thereon.

A width of the accommodating portion AG in the second direction DR2 may be smaller than an interval between the first convex portion VP1 of the first electrode EL1 and the second concave portion CP2 of the second electrode EL2. For example, the width of the accommodating portion AG in the second direction DR2 may be greater than the length of each light emitting element LD (see 'L' in FIGS. 1A and 1B) and may be smaller than the interval between the first convex portion VP1 of the first electrode EL1 and the second concave portion CP2 of the second electrode EL2.

In addition, the first bank BNK1 may have a thickness h2 in the third direction DR3. In this case, a thickness of the second bank BNK2 may be equal (or substantially equal) to the thickness h2 of the first bank BNK1.

As described above, the thickness h1 of the insulating layer INS at the accommodating portion AG is equal to or less than half the thicknesses h2 of the first and second banks BNK1 and BNK2 in the third direction DR3, thereby the light emitting elements LD are more effectively positioned in the accommodating portion AG. As a result, a degree of alignment of the light emitting elements LD between the first and second electrodes EL1 and EL2 may be improved and the number of the light emitting elements LD disposed in a region other than the region between the first and second electrodes EL1 and EL2 may be reduced.

When the thickness h2 of the first bank BNK1 is smaller than the thickness of the second bank BNK2, the thickness h1 of the insulating layer INS at the accommodating portion AG may be equal to or less than half the thickness h2 of the first bank BNK1.

Figure 10:
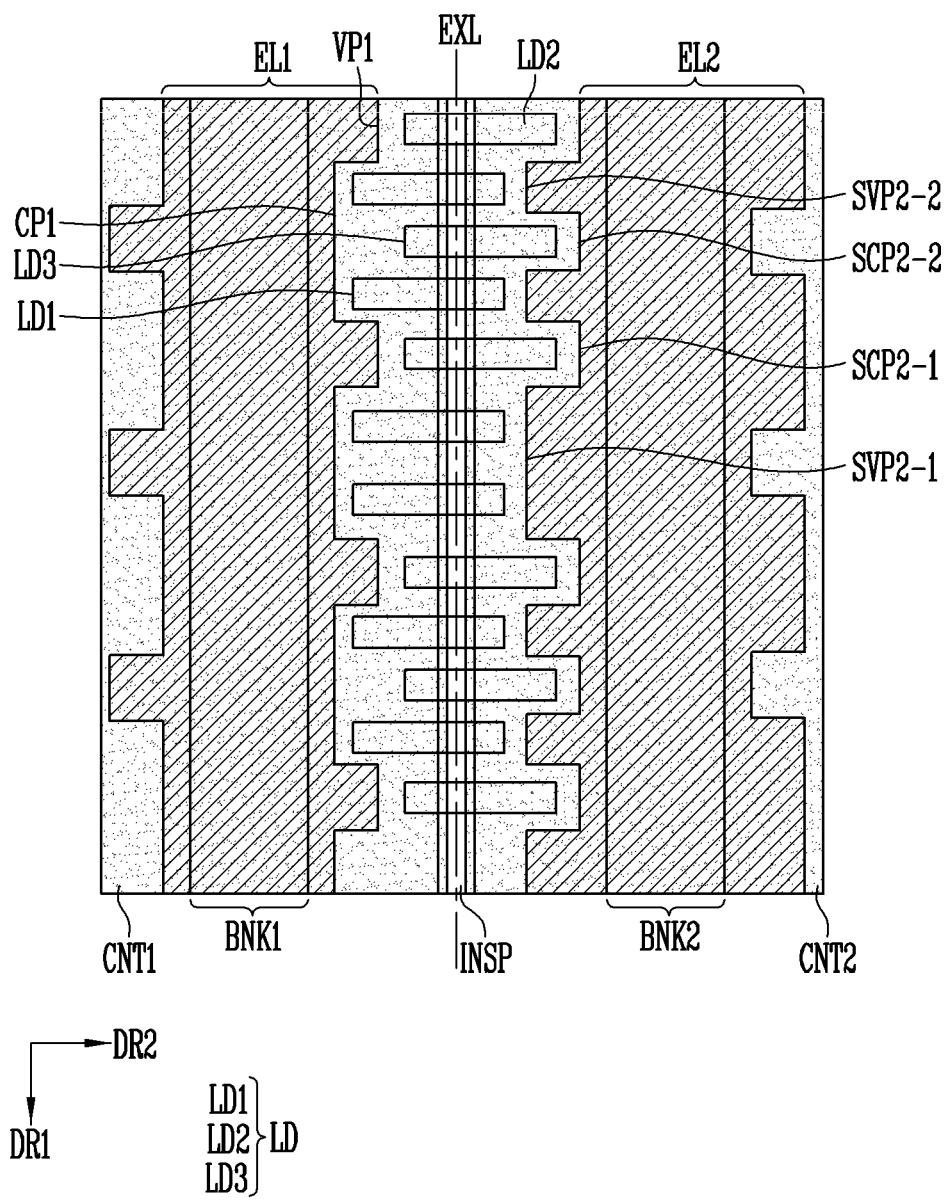
FIG. 10 illustrates a top plan view of a display element layer according to another embodiment of the present invention.

FIG. 10 illustrates a top plan view of a display element layer according to another embodiment of the present invention. Particularly, FIG. 10 illustrates a top plan view of an embodiment of a display element layer DPL in which a third light emitting element LD3 is disposed between the first concave portion CP1 and a second sub concave portion SCP2-2.

Referring to FIG. 10, the display element layer DPL according to an embodiment of the present invention may include the first and second banks BNK1 and BNK2 provided on the substrate SUB, the first and second electrodes EL1 and EL2, the insulating layer INS, the light emitting elements LD, the insulating pattern INSP, and the first and second contact electrodes CNT1 and CNT2.

In an embodiment of the present invention, the second concave portion CP2 may include a first sub concave portion SCP2-1 alternately arranged with the first concave portion CP1 along the first direction DR1 and a second sub concave portion SCP2-2 provided in a partial region of the second electrode EL2 facing the first concave portion CP1 (e.g., the second sub concave portion SCP2-2 is aligned or substantially aligned with the first concave portion CP1 in the second direction DR2).

The second convex portion VP2 may include a first sub convex portion SVP2-1 disposed between the first sub concave portions SCP2-1 along the first direction DR1 and a second sub convex portion SVP2-2 disposed between the first sub concave portion SCP2-1 and the second sub concave portion SCP2-2.

As shown in FIG. 10, because the second sub concave portion SCP2-2 and the second sub convex portion SVP2-2 are provided in a region of the second electrode EL2 facing the first concave portion CP1, a degree of alignment of the light emitting elements LD between the first electrode EL1 and the second electrode EL2 may be improved.

When the second sub concave portion SCP2-2 and the second sub convex portion SVP2-2 are provided in a region of the second electrode EL2 facing the first concave portion CP1, a most protruding portion (e.g., a corner portion) of the second sub convex portion SVP2-2 at where an electric field is concentrated may be further provided in a region facing the first concave portion CP1. Accordingly, the light emitting elements LD may be more effectively arranged between the first concave portion CP1 of the first electrode EL1 and a region of the second electrode EL2 facing the first concave portion CP1.

The light emitting elements LD may include a third light emitting element LD3 disposed between the first concave portion CP1 and the second sub concave portion SCP2-2. Referring to FIG. 10, the first light emitting element LD1 may be disposed between the first concave portion CP1 and the second sub convex portion SVP2-2 and between the first concave portion CP1 and the first sub convex portion SVP2-1. The second light emitting element LD2 may be disposed between the first convex portion VP1 and the first sub concave portion SCP2-1. The third light emitting element LD3 may be disposed between the first concave portion CP1 and the second sub concave portion SCP2-2.

FIGS. 11A to 11D illustrate top plan views of display element layers according to various embodiments of the present invention. Particularly, FIGS. 11A to 11D illustrate top plan views of embodiments of the display element layer DPL including first and second convex portions VP1 and VP2 having various shapes.

In FIGS. 11A to 11D, the shapes of the first and second banks BNK1 and BNK2 do not correspond to (e.g., are different from) the shapes of the first and second electrodes EL1 and EL2 in a plan view, but in various other embodiments, the shapes of the first and second banks BNK1 and BNK2 may correspond to the shapes of the first and second electrodes EL1 and EL2 in a plan view.

Referring to FIGS. 11A to 11D, the display element layer DPL according to embodiments of the present invention may include the first and second banks BNK1 and BNK2 provided on the substrate SUB, the first and second electrodes EL1 and EL2, the insulating layer INS, the light emitting elements LD, the insulating pattern INSP, and the first and second contact electrodes CNT1 and CNT2.

Figure 11A:
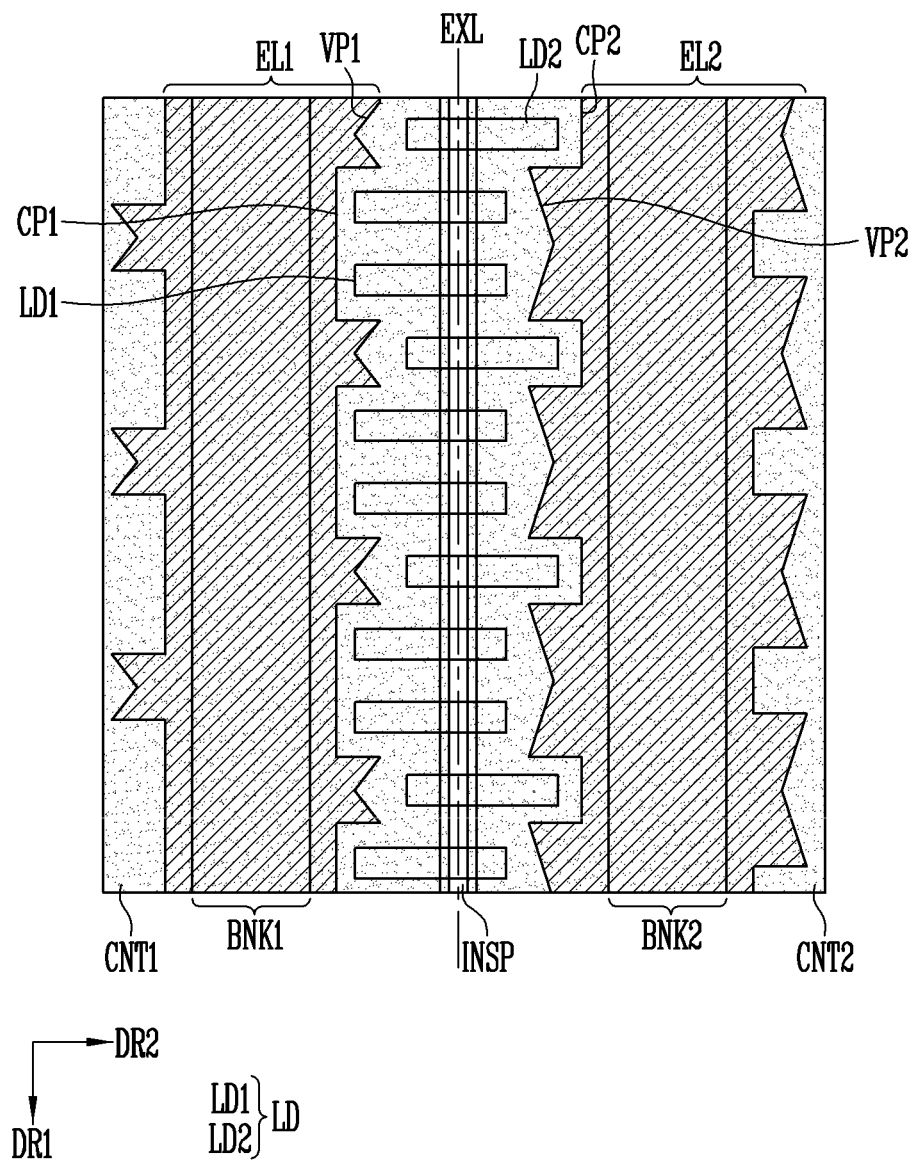
FIGS. 11A to 11D illustrate top plan views of display element layers according to various embodiments of the present invention.

The first and second convex portions VP1 and VP2 may have a polygonal shape or rounded curved shape. For example, as shown in FIG. 4, the first and second convex portions VP1 and VP2 may have a quadrangular shape. As shown in FIG. 11A, the first and second convex portions VP1 and VP2 may have an M shape. In this embodiment, an electric field may be concentrated on a vertex, which is the most protruding portion, of the first and second convex portions VP1 and VP2 having the M shape.

Figure 11B:
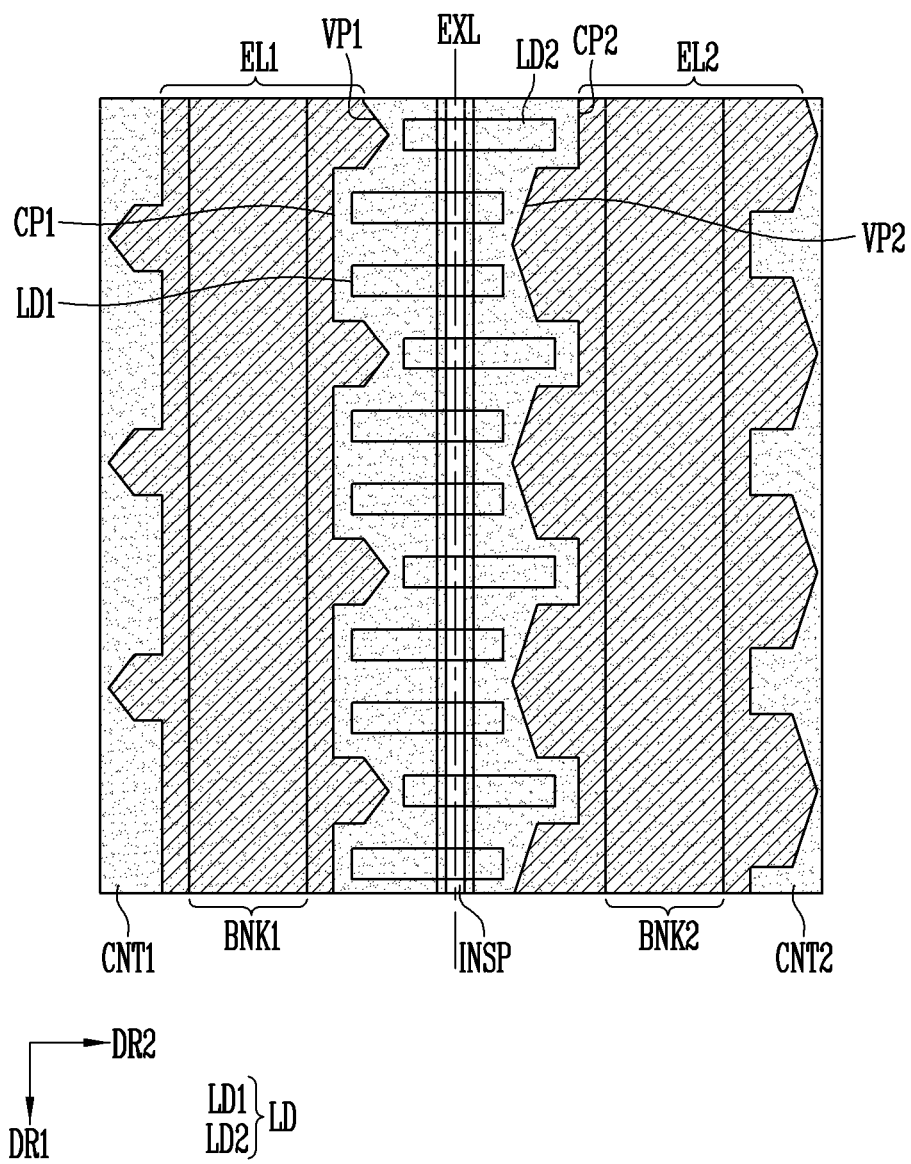
Figure 11C:
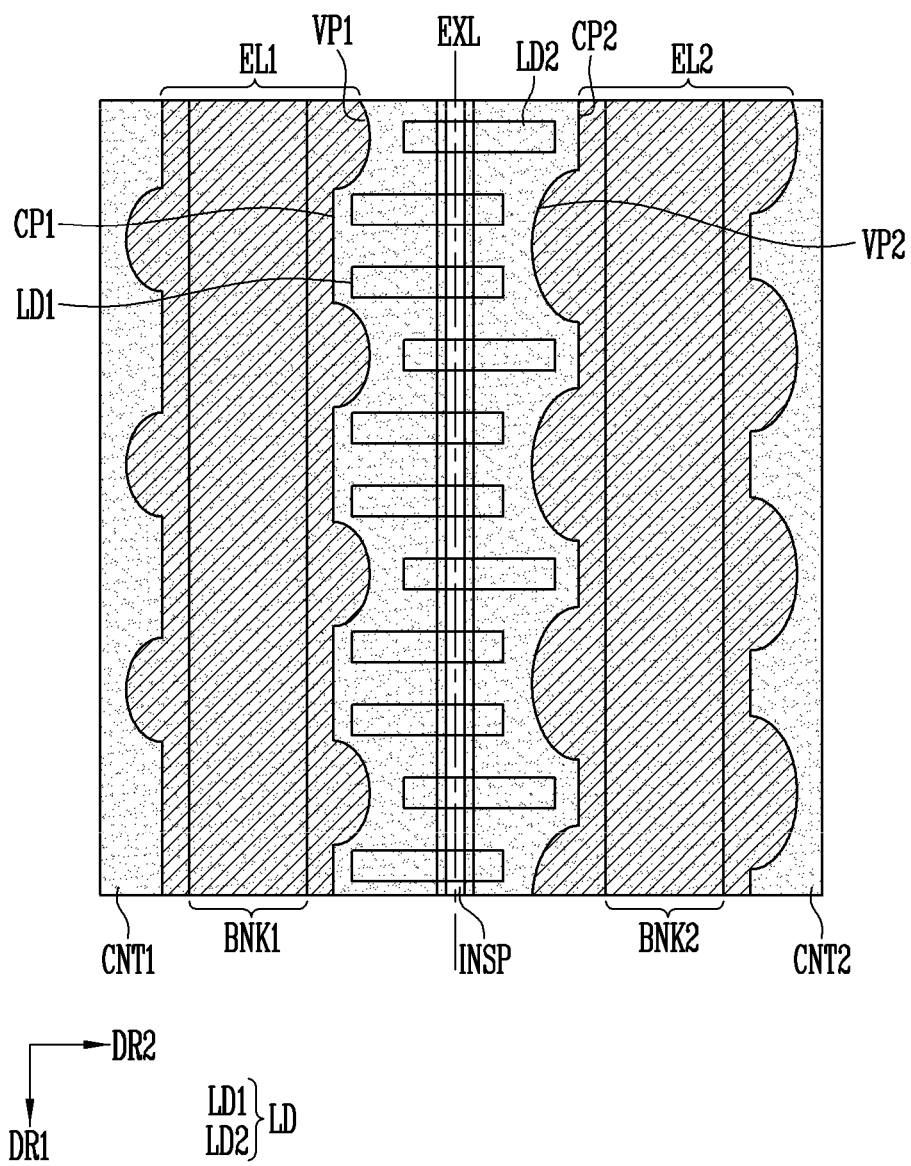
Figure 11D:
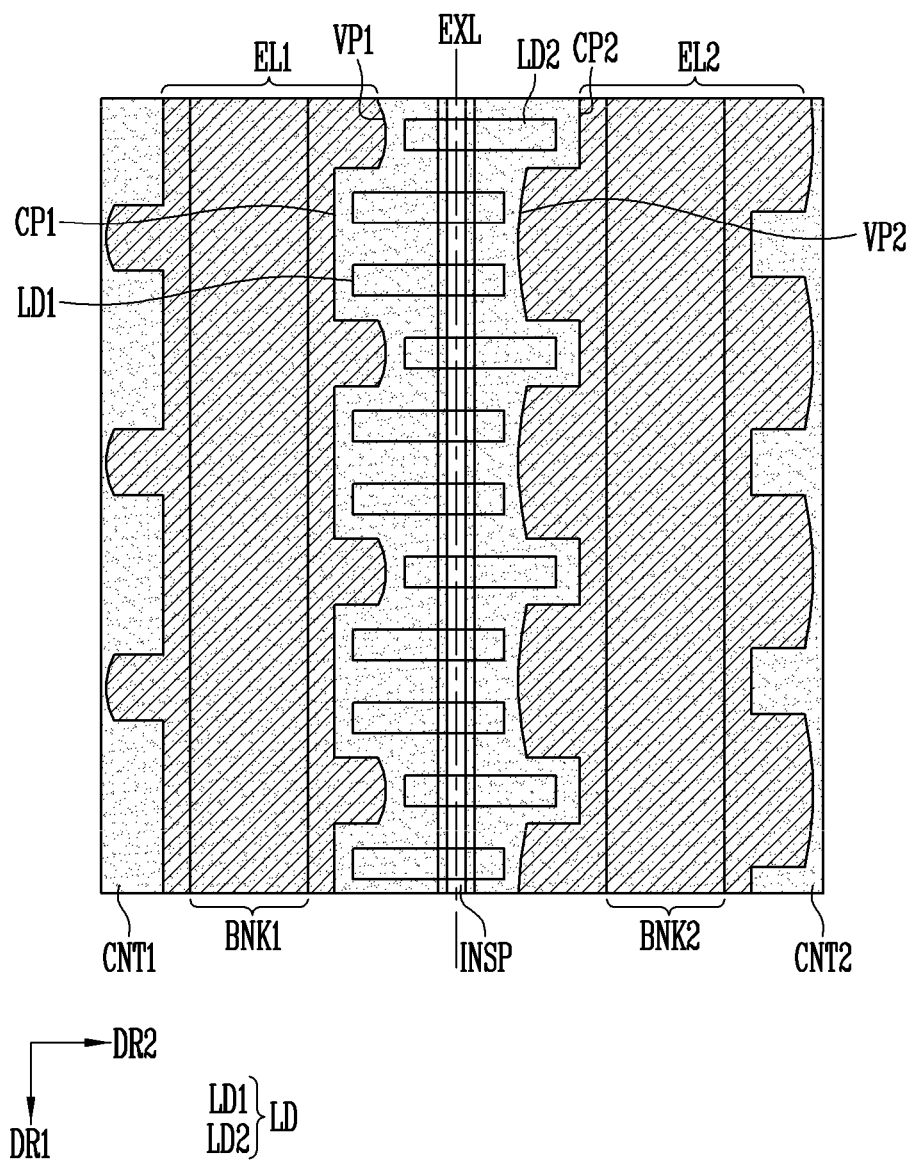

Referring to FIG. 11B, the first and second convex portions VP1 and VP2 may have a semi-hexagonal shape. As shown in FIG. 11C, the first and second convex portions VP1 and VP2 may have a semicircular shape. In addition, as shown in FIG. 11D, the first and second convex portions VP1 and VP2 may have a rounded shape.

However, the shapes of the first and second convex portions VP1 and VP2 are not limited to the above-described shapes and may be variously modified according to the design of the display device. Each of the first and second convex portions VP1 and VP2 may have a shape including a non-square (or non-standard) boundary that is not a standard shape. In this case, the first electrode EU including the first convex portion VP1 and the second electrode EL2 including the second convex portion VP2 may have a non-uniform width along an extending direction (e.g., the extension direction) in a plan view. For example, the first electrode EL1 and the second electrode EL2 may have at least two or more widths (e.g., two or more different widths) along the extending direction. In this case, a region between the first electrode EL1 and the second electrode EL2 (for example, a region in which the light emitting elements LD are arranged) may have at least two or more widths along the extending direction of the first and second electrodes EL1 and EL2.

FIG. 12 illustrates a cross-sectional view of a display device according to an embodiment of the present invention. Particularly, FIG. 12 illustrates a cross-sectional view of a display device including a display element layer DPL in which the first and second electrodes EL1 and EL2 correspond to the shapes of the first and second banks BNK1 and BNK2 and the accommodating portion AG is formed in the insulating layer INS between the first and second electrodes EU and EL2.

As shown in FIG. 12, the display device may include the substrate SUB, the pixel circuit layer PCL, and the display element layer DPL.

The pixel circuit layer PCL may include a buffer layer BFL, a first transistor T1, a second transistor T2, and a driving voltage line DVL.

The buffer layer BFL may be provided on one surface (e.g., an upper surface) of the substrate SUB. The buffer layer BFL may prevent or substantially prevent impurities from diffusing into the first and second transistors T1 and T2. The buffer layer BFL may be a single layer or may be a multilayer including two or more layers. When the multilayer buffer layer BFL is provided, each layer may be formed of the same material or of different materials. In some embodiments, the buffer layer BFL may be omitted depending on a material of the substrate SUB and process conditions.

The first transistor T1 may be a driving transistor electrically connected to the light emitting element LD to drive the light emitting element LD. The second transistor T2 may be a switching transistor electrically connected to the first transistor T1 to switch the first transistor T1.

Each of the first and second transistors T1 and T2 may include a semiconductor layer SCL, a gate electrode GE, a source electrode SE, and a drain electrode DE.

The semiconductor layer SCL may be provided on the buffer layer BFL. The semiconductor layer SCL may include a source region and a drain region that respectively contact corresponding source and drain electrodes SE and DE. A region between the source region and the drain region may be a channel region. The semiconductor layer SCL may be a semiconductor pattern made of (or including) polysilicon, amorphous silicon, an oxide semiconductor, or the like. The channel region may be a semiconductor pattern doped with impurities. For example, n-type impurities, p-type impurities, and other metals may be used as the impurities.

The gate electrode GE may be provided on the corresponding semiconductor layer SCL with a first gate insulating film Gil therebetween.

The source electrode SE and the drain electrode DE included in the first transistor T1 may be respectively connected to the source region and the drain region of the corresponding semiconductor layer SCL through a contact opening (e.g., a contact hole) penetrating through a second gate insulating film GI2 and the first gate insulating film GI1.

The source electrode SE and the drain electrode DE included in the second transistor T2 may be respectively connected to the source region and the drain region of the corresponding semiconductor layer SCL through a contact opening (e.g., a contact hole) penetrating through the second gate insulating film GI2 and the first gate insulating film GI1.

The driving voltage line DVL may be provided on an interlayer insulating layer ILD, but the position of the driving voltage line DVL is not limited thereto. The driving voltage line DVL may be connected to the second driving power source VSS, and a signal corresponding to the driving voltage may be supplied to the driving voltage line DVL from the driver.

The pixel circuit layer PCL may further include a passivation layer PSV covering the first and second transistors T1 and T2. The passivation layer PSV may have a structure including an organic insulating film, an inorganic insulating film, and/or the organic insulating film disposed on the inorganic insulating film. Here, the inorganic insulating film may include at least one of a metal oxide, such as a silicon oxide ($SiO_x$), a silicon nitride ($SiN_x$), a silicon oxynitride (SiON), and an aluminum oxide ($AlO_x$). The organic insulating film may include an organic insulating material capable of transmitting light (e.g., a transparent organic insulating material). The organic insulating film may be, for example, at least one of a polyacrylates resin, an epoxy resin, a phenolic resin, a polyamide resin, a polyimide resin, an unsaturated polyester resin, a polyphenylene ether resin, a polyphenylene sulfide resin, and/or a benzocyclobutene resin.

In addition, while the transistors T1 and T2 have been described as thin film transistors having a top gate structure, the present invention is not limited thereto. In some embodiments, the transistors T1 and T2 may be thin film transistors having a bottom gate structure.

FIG. 12 illustrates the first light emitting element LD1 disposed close to the first concave portion CP1 based on the imaginary extension line EXL. Hereinafter, the first light emitting element LD1 from among the light emitting elements LD will be primarily described.

Referring to FIG. 12, the display element layer DPL may include the first and second banks BNK1 and BNK2, the first and second electrodes EL1 and EL2, the insulating layer INS, the light emitting element LD1, the insulating pattern INSP, and the first and second contact electrodes CNT1 and CNT2.

The first electrode EL1 may be provided on the first bank BNK1, and the second electrode EL2 may be provided on the second bank BNK2. In this embodiment, the shape of the first electrode EL1 may correspond to the shape of the first bank BNK1, and the shape of the second electrode EL2 may correspond to the shape of the second bank BNK2.

The first electrode EL1 may include the first convex portion VP1 and the first concave portion CP1 that are alternately arranged along the first direction DR1, and the second electrode EL2 may include the second convex portion VP2 and the second concave portion CP2 that are alternately arranged along the first direction DR1.

The first bank BNK1 may include the first bank convex portion BVP1 and the first bank concave portion BCP1 that are alternately arranged along the first direction DR1, and the second bank BNK2 may include the second bank convex portion BVP2 and the second bank concave portion BCP2 that are alternately arranged along the first direction DR1.

The first electrode EL1 may be provided on the first bank BNK1 so that the first convex portion VP1 of the first electrode EL1 overlaps the first bank convex portion BVP1 and has a shape corresponding to a planar shape of the first bank convex portion BVP1 and the first concave portion CP1 of the first electrode EL1 overlaps the first bank concave portion BCP1 and has a shape corresponding to a planar shape of the first bank concave portion BCP1. The second electrode EL2 may be provided on the second bank BNK2 so that the second convex portion VP2 of the second electrode EL2 overlaps the second bank convex portion BVP2 and has a shape corresponding to a planar shape of the second bank convex portion BVP2 and the second concave portion CP2 of the second electrode EL2 overlaps the second bank concave portion BCP2 and has a shape corresponding to a planar shape of the second bank concave portion BCP2.

One of the first and second electrodes EL1 and EL2 may be electrically connected to at least one of the plurality of transistors included in the pixel circuit layer PCL.

For example, the second electrode EL2 may be electrically connected to the drain electrode DE of the first transistor T1 through the contact opening penetrating through the passivation layer PSV and the interlayer insulating layer ILD. The source electrode of the first transistor T1 may be electrically connected to the first driving power source VDD. Accordingly, the second electrode EL2 may receive a signal from the first transistor T1.

The first electrode EL1 may be electrically connected to the driving voltage line DVL through the contact opening penetrating through the passivation layer PSV. The driving voltage line may be electrically connected to the second driving power source VSS. Accordingly, the first electrode EL1 may receive a signal from the driving voltage line DVL.

The insulating layer INS may be provided on one surface of the passivation layer PSV provided with the first and second banks BNK1 and BNK2 and the first and second electrodes EL1 and EL2. The light emitting element LD1 may be provided on the insulating layer INS. The insulating layer INS may have the accommodating portion AG, which is recessed (e.g., which is a recessed portion recessed) in the third direction DR3 from the display element layer DPL toward the substrate SUB, and the light emitting element LD1 may be disposed on the accommodating portion AG.

The insulating pattern INSP may be provided on the light emitting element LD1 to fix the position of the light emitting element LD1. One end portion and the other end portion of the light emitting element LD1 may be exposed by the insulating pattern INSP.

The first and second contact electrodes CNT1 and CNT2 may be provided on the insulating layer INS, and one end portion of the light emitting element LD1 exposed by the insulating pattern INSP may contact the first contact electrode CNT1, and the other end portion of the light emitting element LD1 exposed by the insulating pattern INSP may contact the second contact electrode CNT2. In addition, the first contact electrode CNT1 may be connected to the first electrode EU through the contact opening penetrating through the insulating layer INS, and the second contact electrode CNT2 may be connected to the second electrode EL2 through the contact opening penetrating through the insulating layer INS.

Accordingly, the light emitting element LD1 may receive a reference voltage (e.g., a predetermined voltage) through the first electrode EU and the second electrode EL2. When an electric field of a reference voltage or more (e.g., a predetermined voltage or more) is applied to both end portions of the light emitting element LD1, the light emitting element LD1 emits light while the electron-hole pairs are coupled (or joined) in the active layer 12 of the light emitting element LD1.

In addition, because the first contact electrode CNT1 is connected to the first electrode EL1 and the second contact electrode CNT2 is connected to the second electrode EL2, wire resistance of each of the first and second contact electrodes CNT1 and CNT2 is reduced, thereby reducing or minimizing driving failures of the light emitting elements LD due to signal delay.

Light emitted from both end portions of the light emitting element LD1 may be reflected by the first and second electrodes EL1 and EL2 to be directed in an upward direction (e.g., a front surface direction) based on the third direction DR3.

The encap layer INC may be provided on the passivation layer PSV, on which the first and second electrodes EL1 and EL2, the first and second contact electrodes CNT1 and CNT2, and the light emitting elements LD are provided. The encap layer INC may cover the first and second electrodes EL1 and EL2, the first and second contact electrodes CNT1 and CNT2, and the light emitting elements LD so they are not exposed to the outside, thereby preventing or substantially preventing them from corroding.

An overcoat layer may be provided on the encap layer INC. The overcoat layer may be an encapsulation layer that prevents (or substantially prevents) oxygen, moisture, and the like from penetrating into the light emitting elements LD.

FIGS. 13A to 13H are top plan views sequentially illustrating a manufacturing method of a display device according to an embodiment of the present invention. Particularly, FIGS. 13A to 13H are top plan views sequentially illustrating a manufacturing method of a display device in which the first and second electrodes EL1 and EL2 are provided to correspond to the shapes of the first and second banks BNK1 and BNK2 and that includes the display element layer DPL provided with the accommodating portion AG formed between the first and second electrodes EL1 and EL2.

FIGS. 14A to 14I are cross-sectional views sequentially illustrating a manufacturing method of a display device according to an embodiment of the present invention. Particularly, FIGS. 14A to 14I illustrate cross-sectional views taken along the line VII-VII' of FIGS. 13A to 13H.

Hereinafter, the manufacturing method of the display device according to an embodiment of the present invention will be sequentially described with reference to FIGS. 13A to 13H and FIGS. 14A to 14I.

Figure 13A:
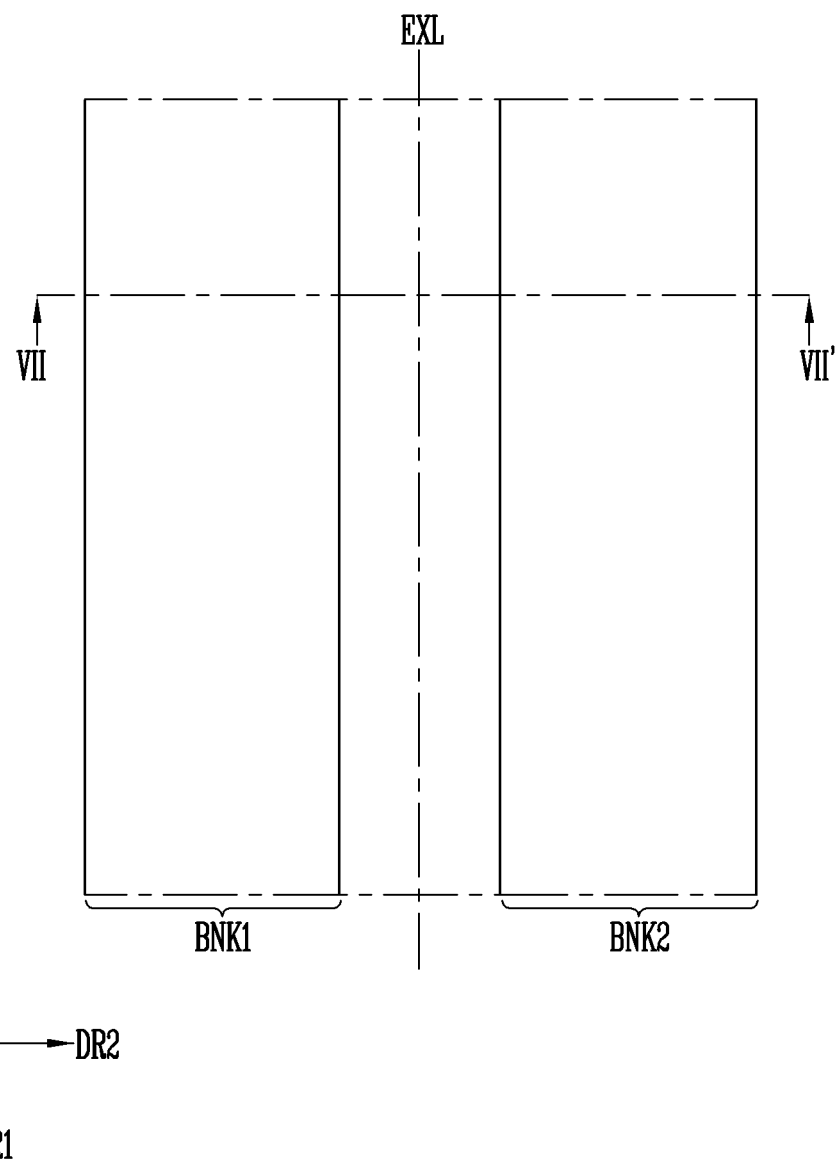
FIGS. 13A to 13H are top plan views sequentially illustrating a manufacturing method of a display device according to an embodiment of the present invention.
Figure 14A:
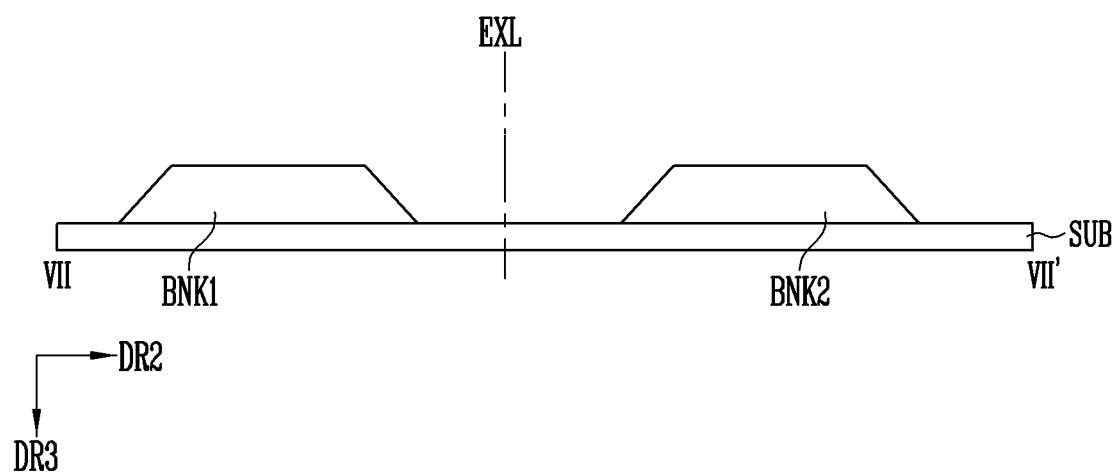
FIGS. 14A to 14I are cross-sectional views sequentially illustrating the manufacturing method of a display device according to the embodiment shown in FIGS. 13A to 13H.

As shown in FIGS. 13A and 14A, the first bank BNK1 and the second bank BNK2 may be formed on one surface of the substrate SUB to extend along the first direction DR1 and be spaced apart from each other along the second direction DR2.

Figure 13B:
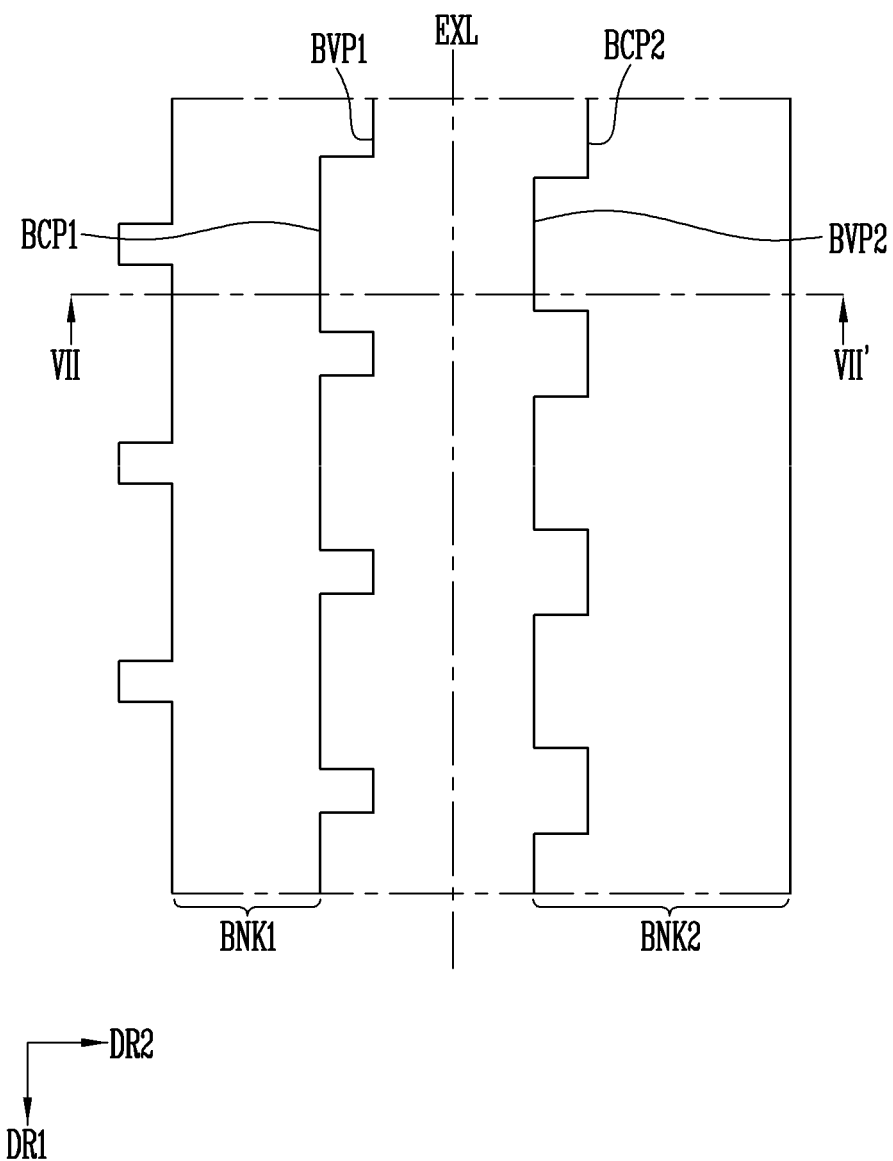
Figure 14B:
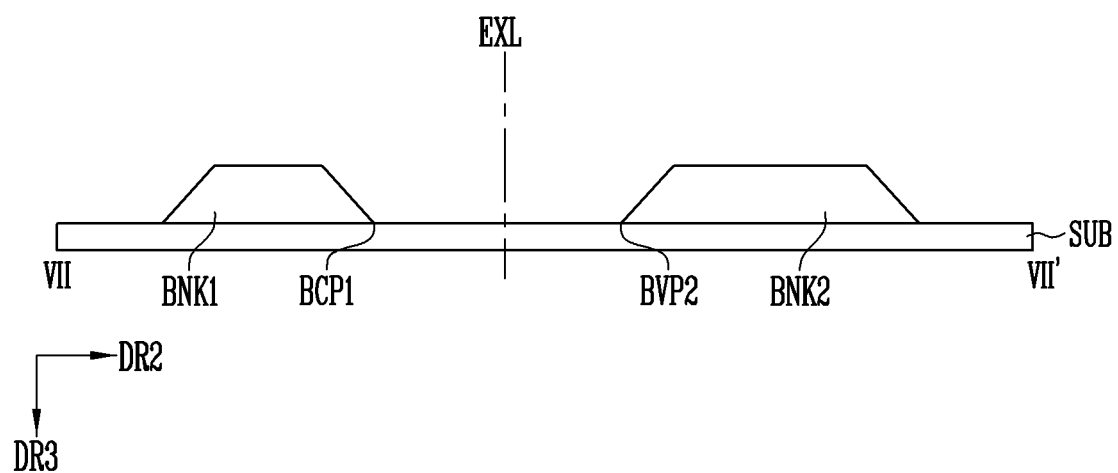

Referring to FIGS. 13B and 14B, the first bank convex portion BVP1, which is convex toward (e.g., which protrudes toward) the second bank BNK2 in a plan view, and the first bank concave portion BCP1, which is concave in a direction opposite to a direction of the first bank convex portion BVP1 (e.g., which is recessed away from the second bank BNK2 and from the first bank convex portion BVP1), may be formed in the first bank BNK1. In addition, the second bank convex portion BVP2, which is convex toward (e.g., which protrudes toward) the first bank BNK1 in a plan view, and the second bank concave portion BCP2, which is concave in a direction opposite to a direction of the second bank convex portion BVP2 (e.g., which is recessed away from the first bank BNK1 and from the second bank convex portion BVP2), may be formed in the second bank BNK2.

By performing an etching process using a half mask, a slit mask, or the like, the first bank convex portion BVP1 and the first bank concave portion BCP1 may be formed in the first bank BNK1 and the second bank convex portion BVP2 and the second bank concave portion BCP2 may be formed in the second bank BNK2. However, the method of forming the first bank convex portion BVP1, the second bank convex portion BVP2, the first bank concave portion BCP1, and the second bank concave portion BCP2 is not limited to these examples.

The first bank concave portion BCP1 and the second bank concave portion BCP2 may be alternately arranged along the first direction DR1, and the first bank convex portion BVP1 and the second bank convex portion BVP2 may be alternately arranged along the first direction DR1. In addition, the first bank convex portion BVP1 may face the second bank concave portion BCP2 (e.g., the first bank convex portion BVP1 may be aligned or substantially aligned with the second bank concave portion BCP2 in the second direction DR2), and the second bank convex portion BVP2 may face the first bank concave portion BCP1 (e.g., the second bank convex portion BVP2 may be aligned or substantially aligned with the first bank concave portion BCP1 in the second direction DR2).

In other embodiments, the first bank convex portion BVP1 and the first bank concave portion BCP1 may not be formed in the first bank BNK1 and the second bank convex portion BVP2 and the second bank concave portion BCP2 may not be formed in the second bank BNK2. Then, the first electrode EL1 and the second electrode EL2 may be formed on the first bank BNK1 and the second BNK2, respectively. In such an embodiment, the display element layer DPL may be provided as shown in FIG. 4.

Hereinafter, an embodiment in which the first bank convex portion BVP1 and the first bank concave portion BCP1 are formed in the first bank BNK1 and the second bank convex portion BVP2 and the second bank concave portion BCP2 are formed in the second bank BNK2, as shown in FIGS. 13B and 14B, will be primarily described.

Figure 13C:
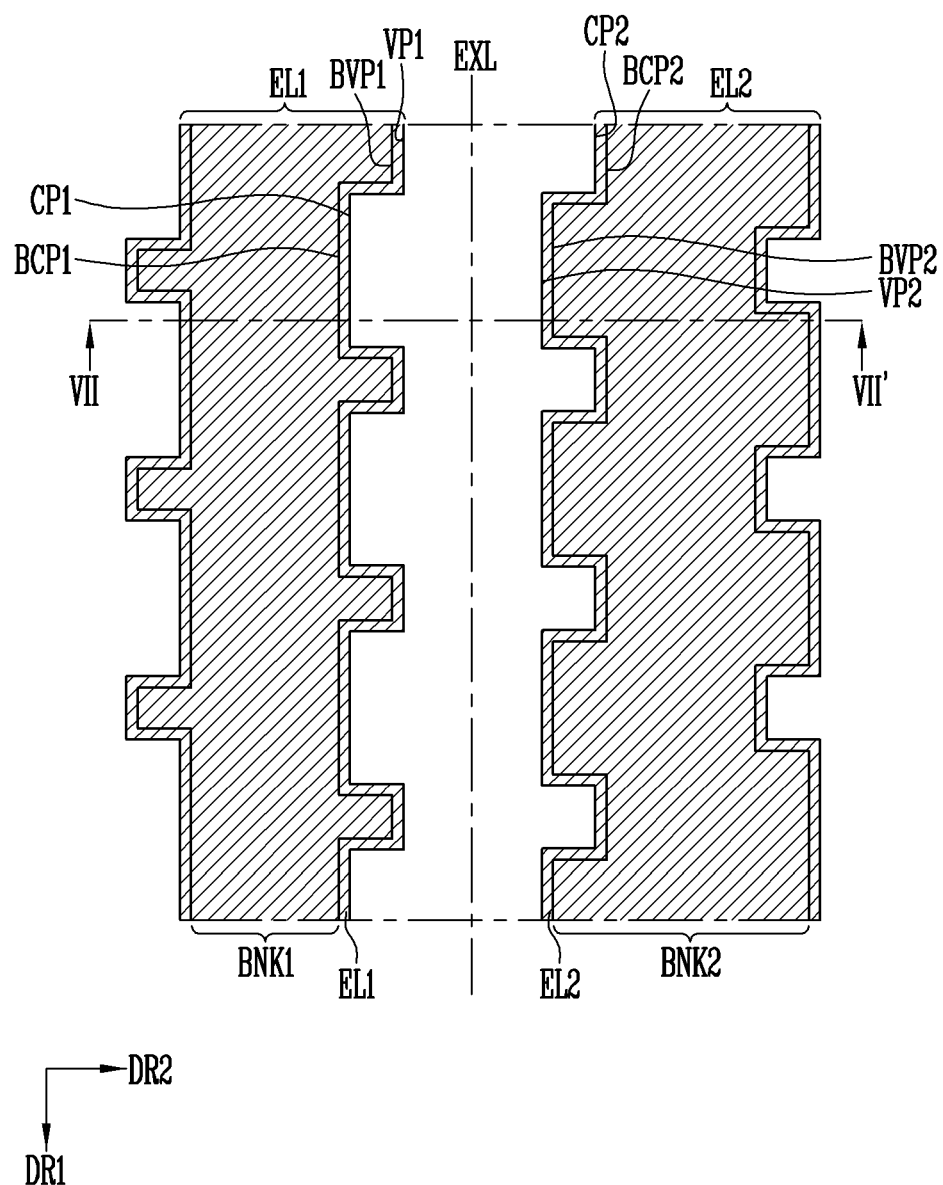
Figure 14C:
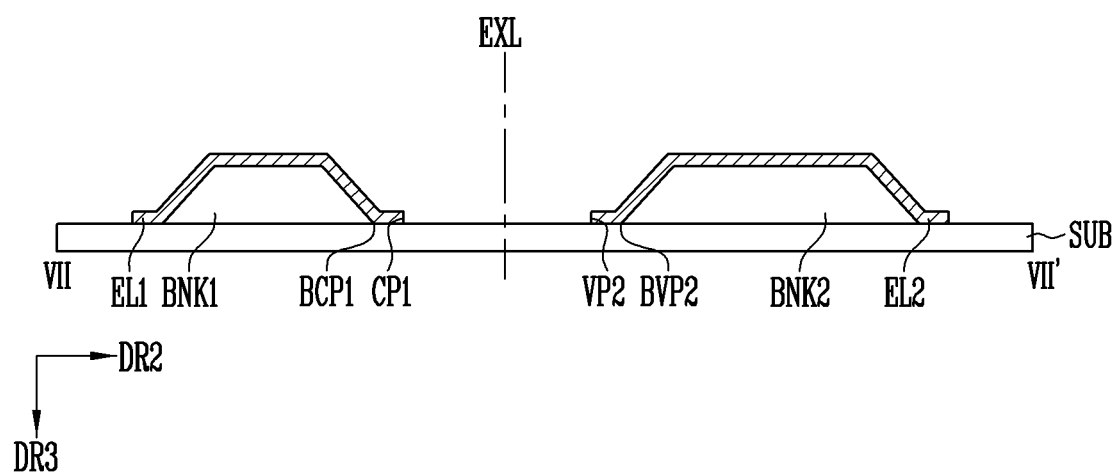

Referring to FIGS. 13C and 14C, a first electrode EL1 may be formed on the first bank BNK1, and a second electrode EL2 may be formed on the second bank BNK2. In this embodiment, the first electrode EL1 may be formed on the first bank BNK1 such that a shape of the first electrode EL1 corresponds to the shape of the first bank BNK1. For example, the first electrode EL1 may be formed to have the first convex portion VP1 that overlaps the first bank convex portion BVP1 and has a shape corresponding to a planar shape of the first bank convex portion BVP1. The first electrode EL1 may be formed to also have the first concave portion CP1 that overlaps the first bank concave portion BCP1 and has a shape corresponding to a planar shape of the first bank concave portion BCP1. Accordingly, as shown in FIG. 6, the display element layer DPL in which the shapes of the first and second electrodes EL1 and EL2 correspond to the shapes of the first and second banks BNK1 and BNK2, respectively, may be provided.

For example, the first electrode EL1 including the first concave portion CP1 and the first convex portion VP1 may be formed on the first bank BNK1 by using a mask having the shape of the first bank BNK1 in a plan view.

In addition, the second electrode EL2 may be formed to have the second convex portion VP2 that overlaps the second bank convex portion BVP2 and has a shape corresponding to a planar shape of the second bank convex portion BVP2. The second electrode EL2 may be formed to also have the second concave portion CP2 that overlaps the second bank concave portion BCP2 and has a shape corresponding to a planar shape of the second bank concave portion BCP2.

The first concave portion CP1 and the second concave portion CP2 may be alternately arranged along the first direction DR1, and the first convex portion VP1 and the second convex portion VP2 may be alternately arranged along the first direction DR1. In addition, the first convex portion VP1 may face (e.g., may be aligned or substantially aligned with) the second concave portion CP2, and the second convex portion VP2 may face (e.g., may be aligned or substantially aligned with) the first concave portion CP1.

Because the first concave portion CP1 and the second convex portion VP2 face each other and the second concave portion CP2 and the first convex portion VP1 face each other, the light emitting elements LD may be effectively arranged between the first and second electrodes EL1 and EL2. For example, because an electric field may be concentrated between the second concave portion CP2 and the first convex portion VP1, the light emitting elements LD may be effectively arranged between the second concave portion CP2 and the first convex portion VP1. In addition, because a strong electric field may be formed between the first concave portion CP1 and the second convex portion VP2 that face each other, the light emitting elements LD may be effectively arranged between the first concave portion CP1 and the second convex portion VP2.

Figure 13D:
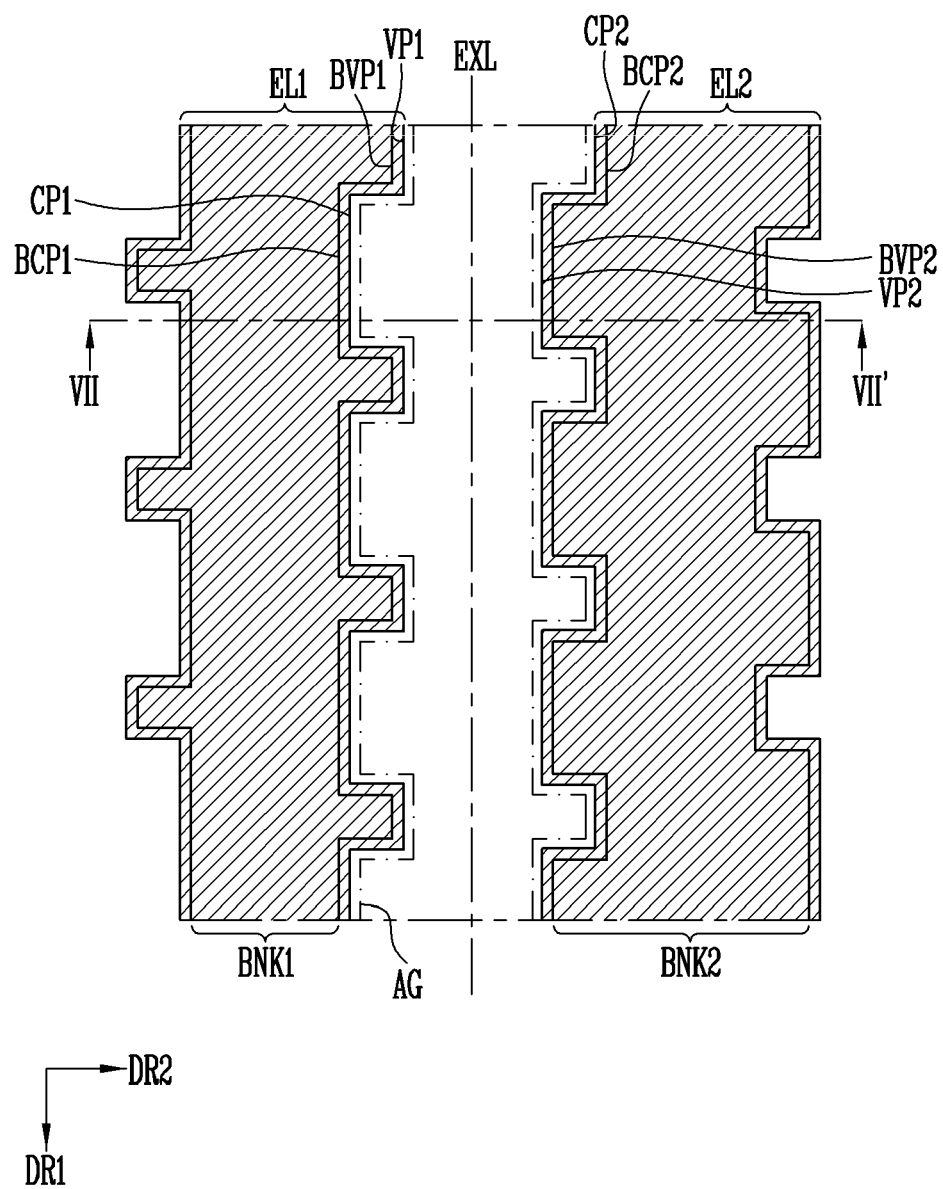
Figure 14D:
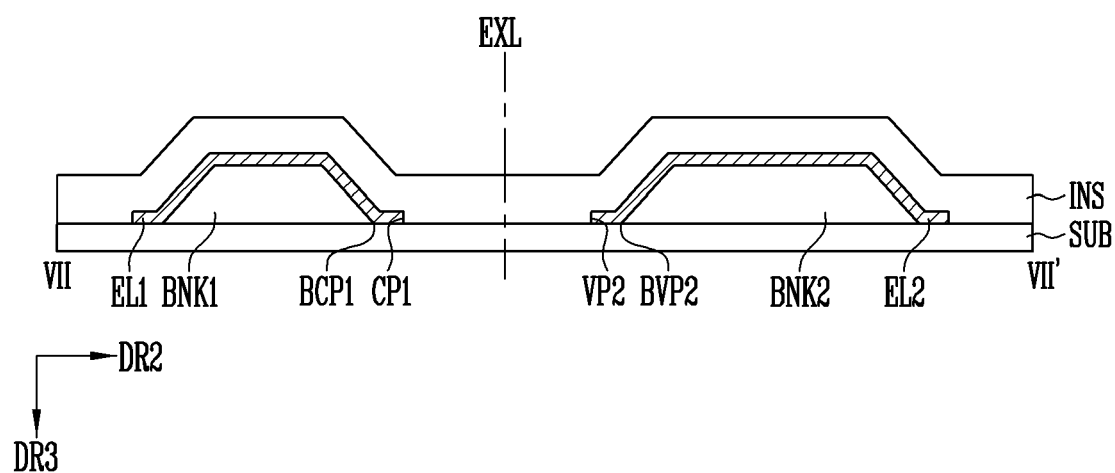

Referring to FIGS. 13D and 14D, the insulating layer INS may be formed on one surface of the substrate SUB on which the first and second banks BNK1 and BNK2 and the first and second electrodes EL1 and EL2 are formed. The first electrode EL1 may cover the first bank BNK1, the second electrode EL2 may cover the second bank BNK2, and the insulating layer INS may cover the first and second electrodes EL1 and EL2.

Figure 14E:
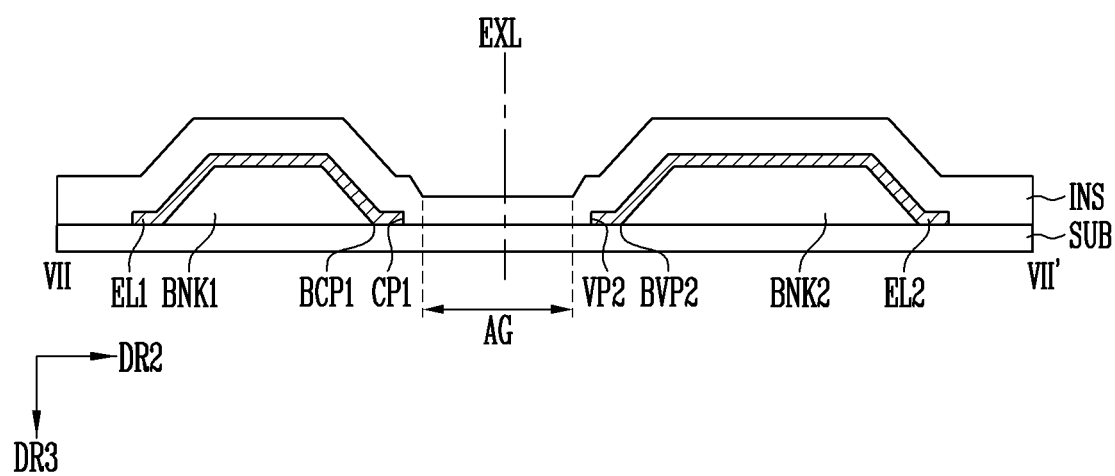

Referring to FIGS. 13D and 14E, the accommodating portion AG in the insulating layer INS, which is recessed in the third direction DR3 toward the substrate SUB, may be formed in the insulating layer INS. In this embodiment, the accommodating portion AG may be formed in a portion of the insulating layer INS between the first electrode EL1 and the second electrode EL2. For example, the accommodating portion AG may be formed by partially etching the insulating layer INS between the first electrode EL1 and the second electrode EL2 by using a slit mask or a halftone mask.

As shown in FIG. 14E, by forming the accommodating portion AG in the insulating layer INS between the first electrode EL1 and the second electrode EL2, the light emitting elements LD provided on the substrate SUB may be easily arranged between the first electrode EL1 and the second electrode EL2. For example, before an alignment signal is applied to the first and second electrodes EL1 and EL2, the light emitting elements LD are positioned in advance (e.g., are pre-positioned) between the first and second electrodes EU and EL2, and thus, an process of arranging the light emitting elements LD may be more efficient. In addition, the number of light emitting elements LD positioned on the first and second banks BNK1 and BNK2 may be reduced; thus, difficulty of a subsequent process may be reduced and equipment may not be contaminated.

In an embodiment of the present invention, the accommodating portion AG may be formed so that a thickness of the insulating layer INS at the accommodating portion AG in the third direction DR3 may be equal to or less than half the thicknesses of the first and second banks BNK1 and BNK2 in the third direction DR3. Accordingly, the light emitting elements LD may be more easily disposed between the first and second electrodes EL1 and EL2.

Figure 13E:
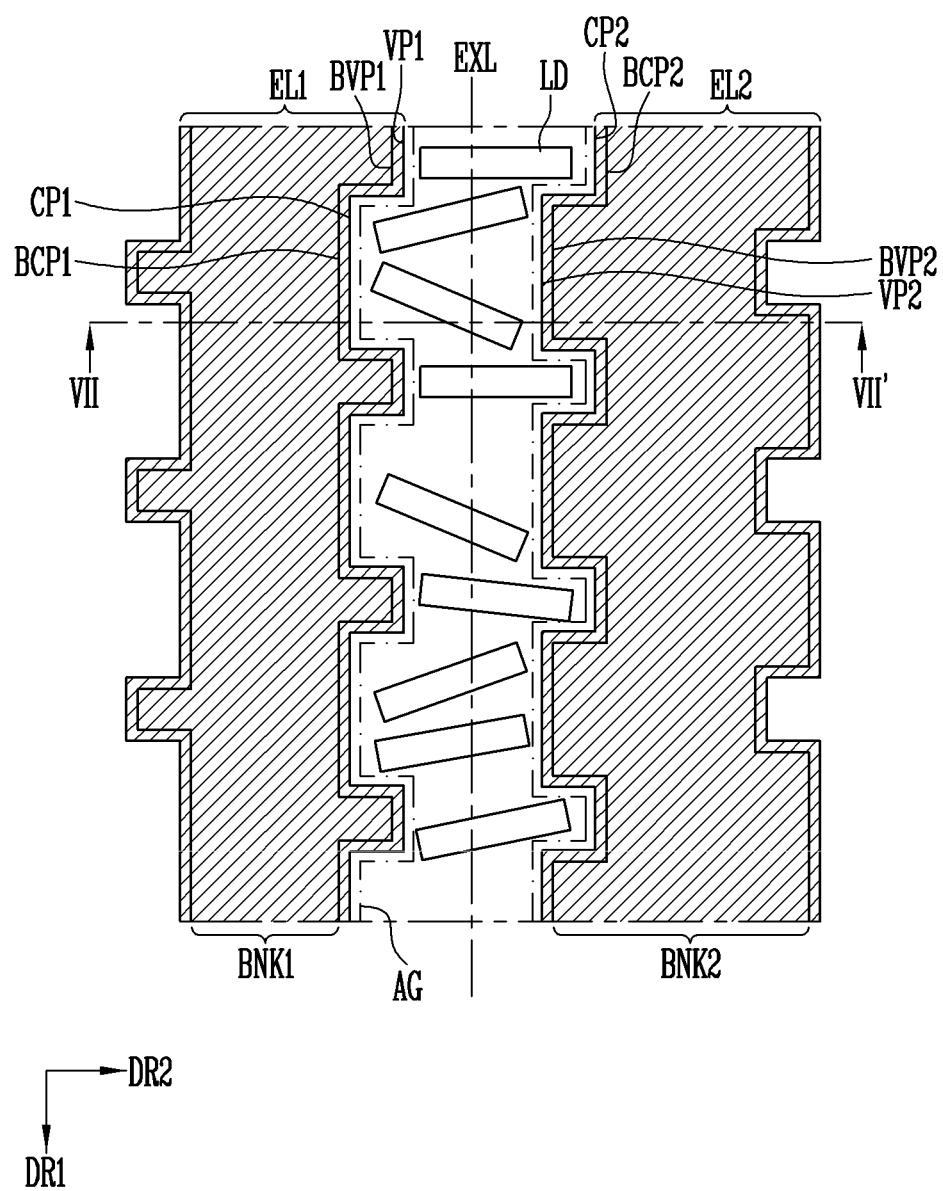

Referring to FIG. 13E, the light emitting elements LD may be provided on the insulating layer INS. For example, the light emitting elements LD may be injected into the light emitting area of each of the pixels PXL through an inkjet printing method, a slit coating method, or various other suitable methods. For example, the light emitting elements LD may be mixed with a volatile solvent and supplied to the light emitting area of each of the pixels PXL through the inkjet printing method or the slit coating method.

For example, an inkjet nozzle may be disposed on the insulating layer INS, and a solvent, in which a plurality of light emitting elements LD are mixed, may be injected into the light emitting area of each of the pixels PXL through the inkjet nozzle. The solvent may be one or more of acetone, water, alcohol, and/or toluene, but the present invention is not limited thereto. For example, the solvent may be in a form of an ink or a paste. The method of inserting the light emitting elements LD into the light emitting area of each of the pixels PXL is not limited to the above-described embodiment, and methods of inserting the light emitting elements LD may be variously changed.

The solvent may be removed after the light emitting elements LD are injected into the light emitting area of each of the pixels PXL.

Figure 13F:
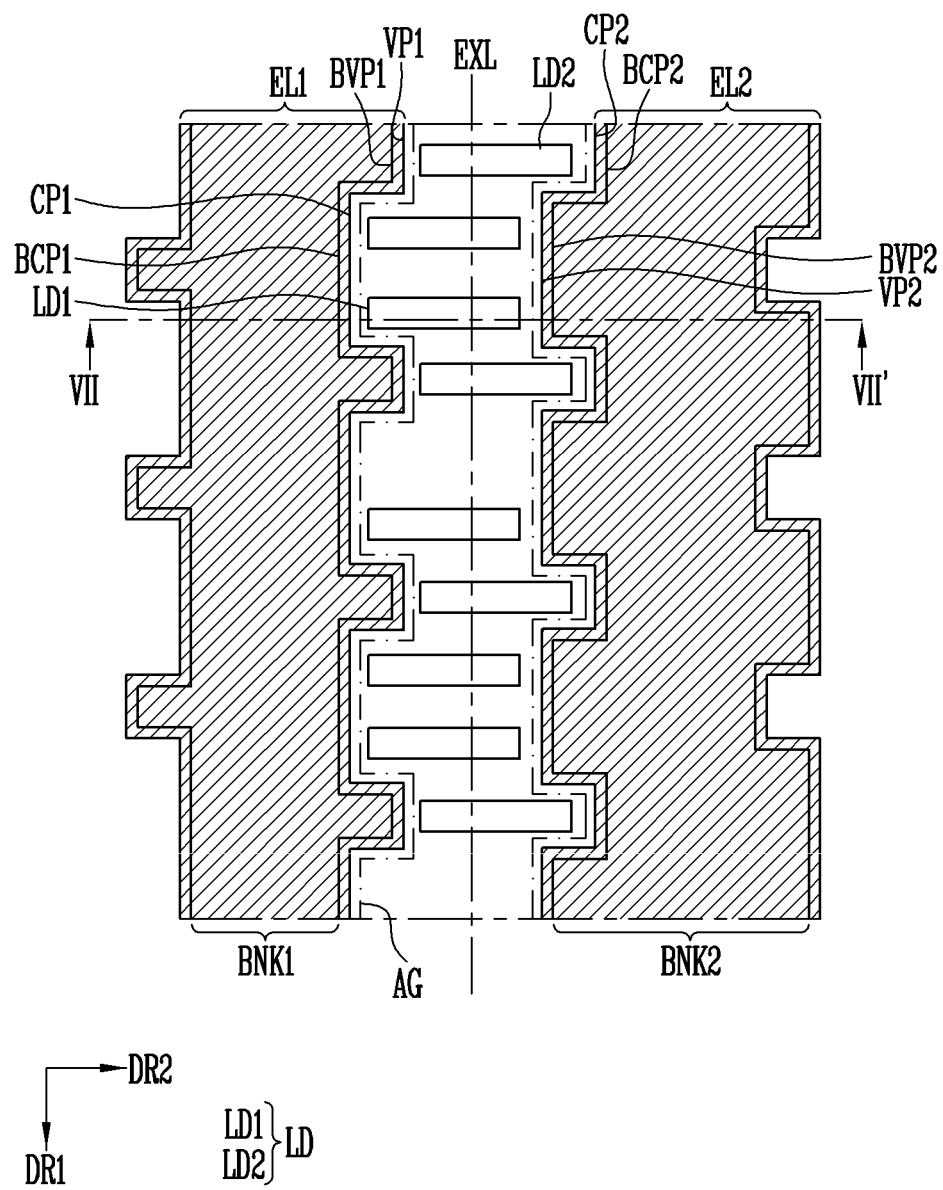
Figure 14F:
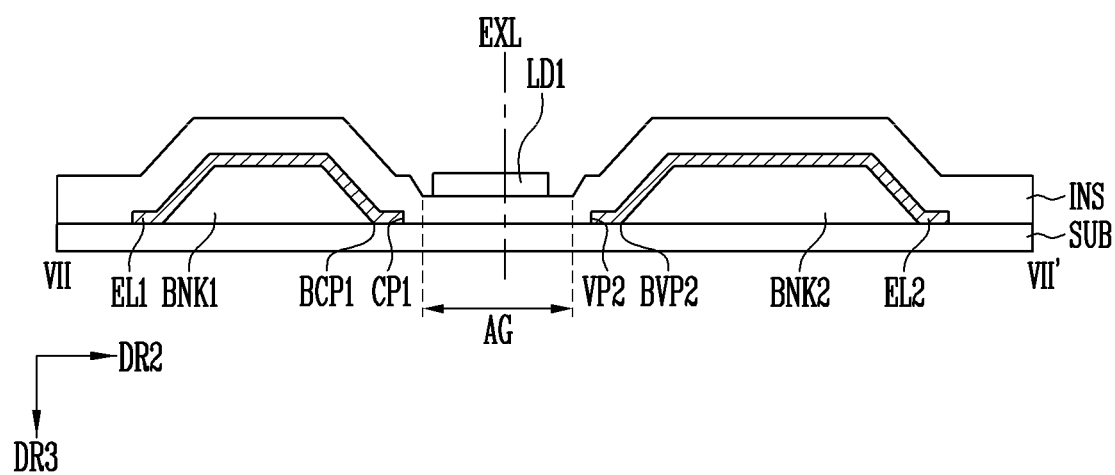

Referring to FIGS. 13F and 14F, by applying an alignment signal to the first and second electrodes EL1 and EL2, the light emitting elements LD are arranged between the first and second electrodes EL1 and EL2.

A first alignment signal applied to the first electrode EL1 and a second alignment signal applied to the second electrode EL2 may have a voltage difference and/or a phase difference such that the light emitting elements LD may be arranged between the first electrode EL1 and the second electrode EL2. For example, the first alignment signal and the second alignment signal may have different voltage levels. In addition, at least one of the first alignment signal and the second alignment signal may be an alternating current signal, but the present invention is not limited thereto.

In addition, while the light emitting elements LD are arranged, the alignment signal (or alignment voltage) applied to the first electrode EL1 and the second electrode EL2 for forming a magnetic field may be controlled such that the light emitting elements LD may be arranged to be relatively deflected (e.g., relatively arranged to face) between the first electrode EL1 and the second electrode EL2. For example, the light emitting elements LD may be deflected and arranged so that one end portion thereof is directed to the first electrode EL1 and the other end portion thereof is directed to the second electrode EL2. In other embodiments, the light emitting elements LD may be deflected and arranged so that the one end portion thereof is directed to the second electrode EL2 and the other end portion thereof is directed to the first electrode EL1.

When the alignment signals are applied to the first and second electrodes EL1 and EL2, the first light emitting element LD1 may be arranged between the first concave portion CP1 and the second convex portion VP2, and the second light emitting element LD2 may be arranged between the second concave portion CP2 and the first convex portion VP1.

Based on the imaginary extension line EXL extending in the first direction DR1 between the first electrode EL1 and the second electrode EL2, the first light emitting element LD1 may be arranged close to the first concave portion CP1 (e.g., adjacent to or aligned with the first concave portion CP1 in the second direction DR2), and the second light emitting element LD2 may be arranged close to the second concave portion CP2 (e.g., adjacent to or aligned with the second concave portion CP2 in the second direction DR2).

Figure 13G:
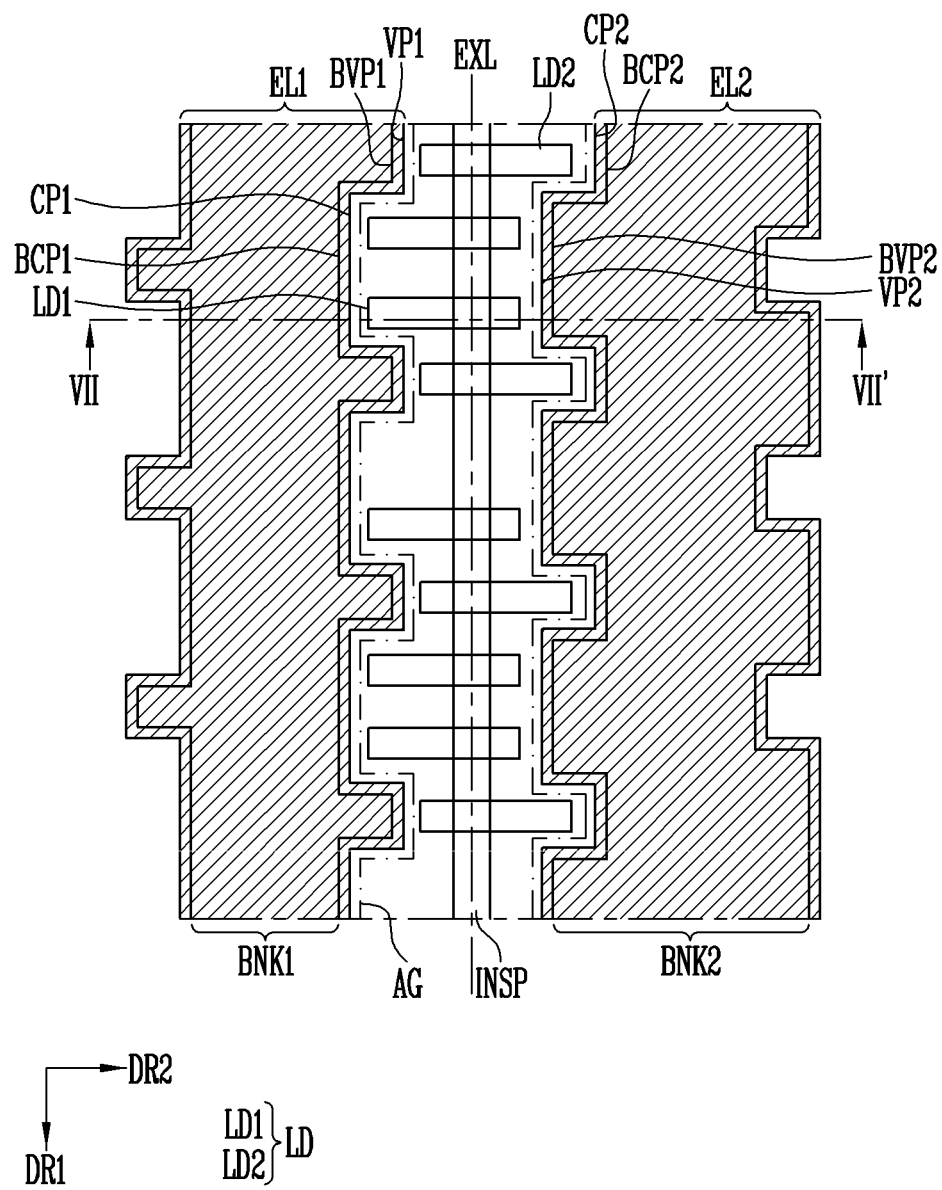
Figure 14G:
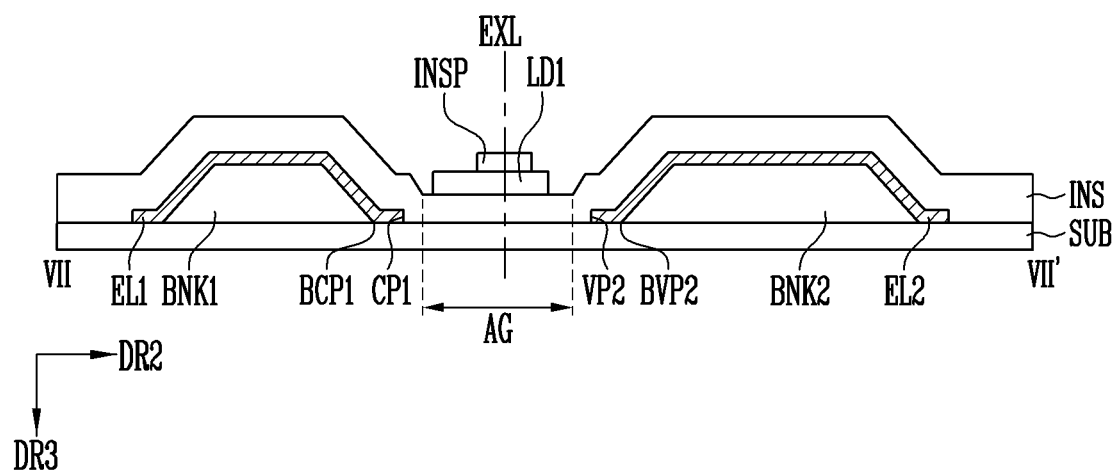

Referring to FIGS. 13G and 14G, the insulating pattern INSP may be formed on the light emitting elements LD. The insulating pattern INSP may be provided on the light emitting elements LD in a continuous state along the first direction DR1 (e.g., the insulating pattern INSP may continuously extend over a plurality of the light emitting elements LD, such as all of the light emitting elements LD in one light emitting area). The positions of the light emitting elements LD arranged between the first electrode EL1 and the second electrode EL2 may be fixed by the insulating pattern INSP.

Figure 13H:
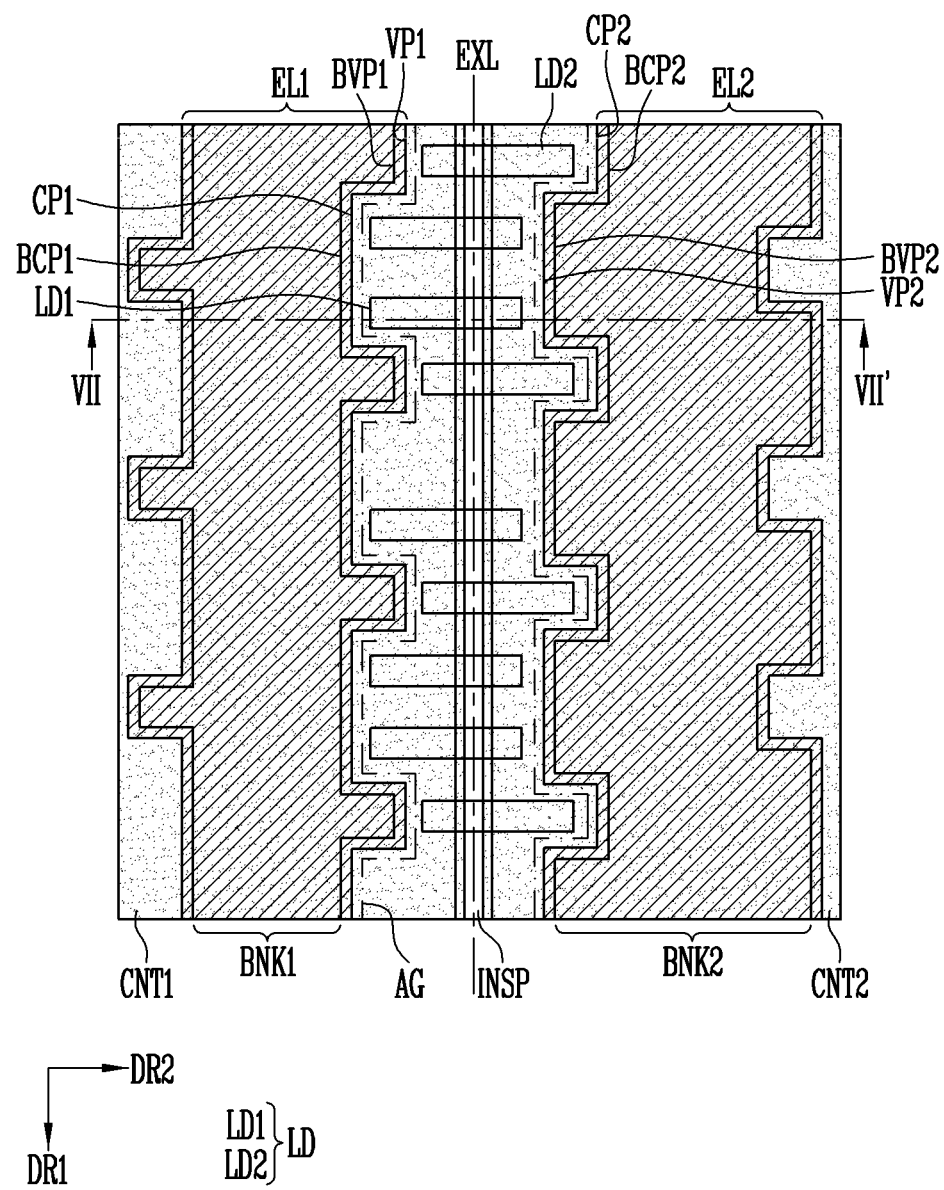
Figure 14H:
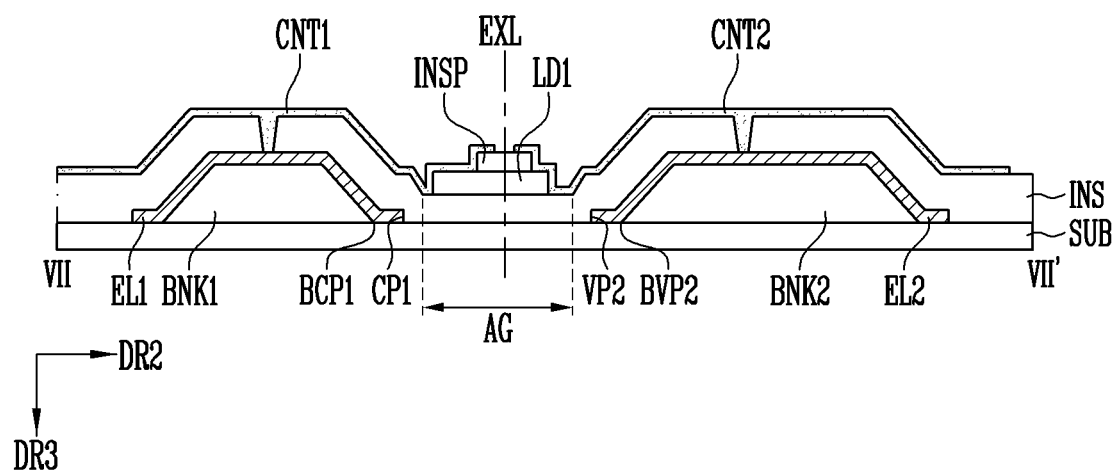

Referring to FIGS. 13H and 14H, the first contact electrode CNT1 electrically connecting the first electrode EU and the light emitting elements LD and the second contact electrode CNT2 electrically connecting the second electrode EL2 and the light emitting elements LD may be formed.

The first contact electrode CNT1 may be connected to the first electrode EL1 through a contact opening (e.g., a contact hole) penetrating through the insulating layer INS and may contact one end portion of the light emitting element LD exposed by the insulating pattern INSP. In addition, the second contact electrode CNT2 may be connected to the second electrode EL2 through a contact opening (e.g., a contact hole) penetrating through the insulating layer INS and may contact the other end portion of the light emitting element LD exposed by the insulating pattern INSP. Accordingly, the first and second electrodes EL1 and EL2 may be electrically connected to the light emitting element LD.

Figure 14I:
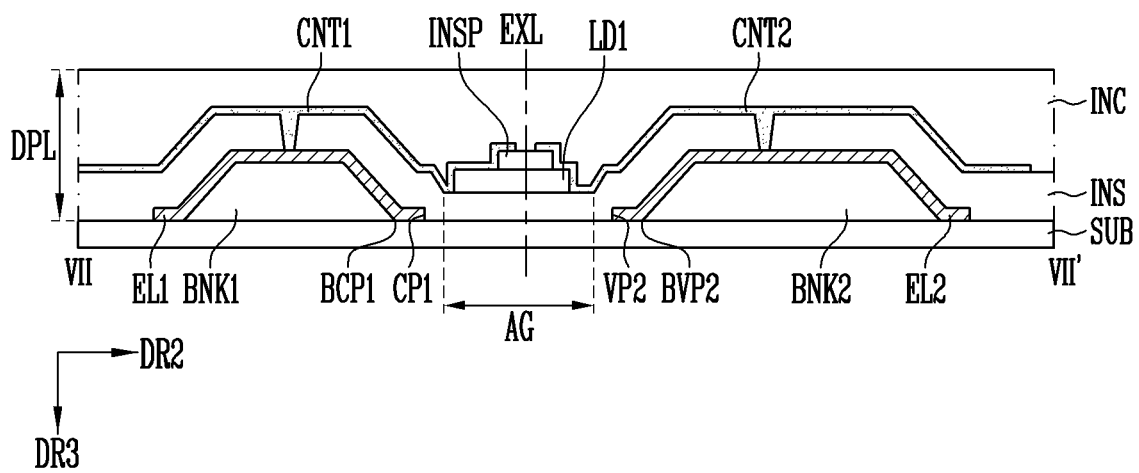

Referring to FIG. 14I, the encap layer INC may be formed on one surface of the substrate SUB on which the first and second electrodes EL1 and EL2, the first and second contact electrodes CNT1 and CNT2, and the light emitting elements LD are provided.

The above-detailed description illustrates and explains aspects and features of the present invention. In addition, the above-detailed description merely illustrates example embodiments of the present invention; the present invention may be used in various combinations, changes, and environments in addition to those described above, and the scope of the inventive concepts disclosed herein may be changed or modified within the scope of equivalents and/or techniques or knowledge in the art. Therefore, the above-detailed description is not intended to limit the present invention to the disclosed embodiments. In addition, the appended claims should be construed to include their equivalents as well.

What is claimed is:

1. A display device comprising:
   a substrate; and
   a display element layer on one surface of the substrate, the display element layer comprising:

first and second electrodes extending along a first direction and spaced apart from each other in a second direction different from the first direction; and light emitting elements electrically connected to the first electrode and the second electrode, wherein the first electrode has, in a plan view, a first convex portion convex toward the second electrode and a first concave portion concave in a direction away from the second electrode, wherein the second electrode has, in the plan view, a second convex portion convex toward the first electrode and a second concave portion concave in a direction away from the first electrode, and wherein the light emitting elements comprise, based on an imaginary extension line extending in the first direction between the first electrode and the second electrode, a first light emitting element close to the first concave portion, and a second light emitting element close to the second concave portion.

2. The display device of claim 1, wherein the first concave portion and the second concave portion are alternately arranged along the first direction, and wherein the first convex portion and the second convex portion are alternately arranged along the first direction.

3. The display device of claim 2, wherein the first convex portion faces the second concave portion, and wherein the second convex portion faces the first concave portion.

4. The display device of claim 3, wherein the first light emitting element is between the first concave portion and the second convex portion, and wherein the second light emitting element is between the second concave portion and the first convex portion.

5. The display device of claim 1, wherein the display element layer further comprises:

a first contact electrode electrically connecting the first electrode to the light emitting elements, and a second contact electrode electrically connecting the second electrode to the light emitting elements.

6. The display device of claim 5, wherein an area at where the first contact electrode overlaps the first light emitting element is greater than an area at where the second contact electrode overlaps the first light emitting element.

7. The display device of claim 5, wherein an area at where the first contact electrode overlaps the second light emitting element is smaller than an area at where the second contact electrode overlaps the second light emitting element.

8. The display device of claim 1, wherein the display element layer further comprises a first bank and a second bank on the substrate, extending along the first direction, and spaced apart from each other along the second direction, and wherein the first electrode is on the first bank, and the second electrode is on the second bank.

9. The display device of claim 8, wherein the first bank has a first bank convex portion convex toward the second bank in the plan view and a first bank concave portion concave in a direction away from the second bank, and wherein the second bank has a second bank convex portion convex toward the first bank in the plan view and a second bank concave portion concave in a direction away from the first bank.

10. The display device of claim 9, wherein the first convex portion overlaps the first bank convex portion and has a shape corresponding to a planar shape of the first bank convex portion, and the first concave portion overlaps the first bank concave portion and has a shape corresponding to a planar shape of the first bank concave portion, and wherein the second convex portion overlaps the second bank convex portion and has a shape corresponding to a planar shape of the second bank convex portion, and the second concave portion overlaps the second bank concave portion and has a shape corresponding to the planar shape of the second bank concave portion.

11. The display device of claim 8, wherein the display element layer further comprises an insulating layer covering the first and second electrodes, and wherein the light emitting elements are on the insulating layer.

12. The display device of claim 11, wherein the insulating layer has an accommodating portion between the first electrode and the second electrode and recessed in a third direction toward the substrate, and wherein the light emitting elements are on the accommodating portion of the insulating layer.

13. The display device of claim 12, wherein a thickness of the insulating layer at the accommodation portion in the third direction is equal to or less than half the thicknesses of the first and second banks in the third direction.

14. The display device of claim 1, wherein the second concave portion has a first sub concave portion alternately arranged with the first concave portion along the first direction and a second sub concave portion facing the first concave portion.

15. The display device of claim 14, wherein the light emitting elements further comprise a third light emitting element between the first concave portion and the second sub concave portion.

16. The display device of claim 1, wherein the first and second convex portions have a polygonal shape or a rounded curved shape.

17. The display device of claim 1, wherein each of the first and second electrodes has at least two widths along the first direction.

18. The display device of claim 17, wherein the first convex portion and the second convex portion have a non-square boundary.

19. The display device of claim 18, wherein a region between the first electrode and the second electrode has a width that is not constant along the first direction.

20. A manufacturing method of a display device, the method comprising:

forming a first bank and a second bank on a substrate, the first bank and the second bank extending along a first direction and spaced apart from each other along a second direction different from the first direction;

forming a first electrode on the first bank and a second electrode on the second bank, the first electrode having, in a plan view, a first convex portion convex toward the second electrode and a first concave portion concave in a direction away from the second electrode, the second electrode having, in the plan view, a second convex portion convex toward the first electrode and a second concave portion concave in a direction away from the first electrode;

providing light emitting elements on the substrate after the forming of the first and second electrodes; and arranging the light emitting elements between the first electrode and the second electrode by applying an alignment signal to the first and second electrodes, the arranged light emitting elements comprising a first light emitting element close to the first concave portion and a second light emitting element close to the second concave portion.

21. The manufacturing method of the display device of claim 20, wherein the forming of the first bank and the second bank comprises:
   forming, in the first bank, a first bank convex portion convex toward the second bank in the plan view and a first bank concave portion concave in a direction away from the second bank; and
   forming, in the second bank, a second bank convex portion convex toward the first bank in the plan view and a second bank concave portion concave in a direction away from the first bank.

22. The manufacturing method of the display device of claim 20, further comprising:
   forming an insulating layer covering the first and second electrodes, and
   forming an accommodating portion in the insulating layer between the first electrode and the second electrode, the accommodating portion being recessed in a third direction toward the substrate.

23. The manufacturing method of the display device of claim 20, further comprising forming a first contact electrode electrically connecting the first electrode and the light emitting elements and a second contact electrode electrically connecting the second electrode and the light emitting elements.

* * * * *